US012680528B2

(12) United States Patent
Smith

(10) Patent No.:  US 12,680,528 B2
(45) Date of Patent:  *Jul. 14, 2026

(54) SYSTEMS AND METHODS FOR POWER DISTRIBUTION AND HARNESSING OF MARINE HYDROKINETIC ENERGY

(71) Applicant: Riahmedia Inc., San Marcos, CA (US)

(72) Inventor: Earnest Smith, San Marcos, CA (US)

(73) Assignee: Riahmedia Inc., San Marcos, CA (US)

( * ) Notice: Subject to any disclaimer, the term of this patent is extended or adjusted under 35 U.S.C. 154(b) by 12 days.

This patent is subject to a terminal disclaimer.

(21) Appl. No.: 18/793,665

(22) Filed: Aug. 2, 2024

(65) Prior Publication Data

US 2025/0092851 A1     Mar. 20, 2025

Related U.S. Application Data

(63) Continuation of application No. 17/846,779, filed on Jun. 22, 2022, now Pat. No. 12,085,053.

(Continued)

(51) Int. Cl.
*F03B 13/26* (2006.01)
*F03B 17/06* (2006.01)
(Continued)

(52) U.S. Cl.
CPC ............ *F03B 13/26* (2013.01); *F03B 13/264* (2013.01); *F03B 17/06* (2013.01); *F05B 2220/32* (2013.01);
(Continued)

(58) Field of Classification Search
CPC ........ F03B 13/264; F03B 17/06; F03B 13/26; F05B 2240/97; F05B 2240/24;
(Continued)

(56) References Cited

U.S. PATENT DOCUMENTS 3,754,147 A     8/1973   Hancock et al.
3,803,422 A     4/1974   Krickler
(Continued)

FOREIGN PATENT DOCUMENTS

WO     2022/036000 A1     2/2022
WO     2024/151739 A1     7/2024

OTHER PUBLICATIONS

International Search Report and Written Opinion, mailed May 30, 2024 for International Application Serial No. PCT/US2024/011055 filed Jan. 10, 2024.

(Continued)

*Primary Examiner* — Hoang M Nguyen
(74) *Attorney, Agent, or Firm* — K&L Gates LLP; Brian J. Novak; Giorgios N. Kefallinos

(57) ABSTRACT

An example system comprises an enclosure configured to be submerged in a body of water. The system also comprises a capture device coupled to the enclosure. The capture device includes a rotor shaft and a plurality of blades coupled to the rotor shaft. The plurality of blades are arranged to receive a flow of water when the enclosure is submerged in the body of water. The flow of water causes the plurality of blades to rotate the rotor shaft. The system also comprises a transfer device extending lengthwise from a first end to a second end of the transfer device. The transfer device is mechanically coupled to the capture device at the first end and configured to transfer a torque of the rotating rotor shaft from the first end to the second end. The second end is located outside the enclosure.

18 Claims, 14 Drawing Sheets

Related U.S. Application Data

(60) Provisional application No. 63/220,826, filed on Jul. 12, 2021, provisional application No. 63/213,332, filed on Jun. 22, 2021.

(51) Int. Cl.

| | |
|---|---|
| *H10B 80/00* | (2026.01) |
| *H10W 72/00* | (2026.01) |
| *H10W 72/90* | (2026.01) |
| *H10W 90/00* | (2026.01) |
| *H10W 90/24* | (2026.01) |

(52) U.S. Cl.
CPC ... *F05B 2240/24* (2013.01); *F05B 2240/2411* (2013.01); *F05B 2240/97* (2013.01); *F05B 2260/4021* (2013.01); *F05B 2260/406* (2013.01); *F05B 2260/422* (2020.08); *F05B 2260/60* (2013.01); *H10B 80/00* (2023.02); *H10W 72/884* (2026.01); *H10W 72/9445* (2026.01); *H10W 90/00* (2026.01); *H10W 90/24* (2026.01); *H10W 90/732* (2026.01); *H10W 90/734* (2026.01); *H10W 90/754* (2026.01)

(58) Field of Classification Search
CPC ........ F05B 2260/406; F05B 2260/4021; F05B 2260/422; F05B 2220/32; F05B 2240/2411; F05B 2260/60
USPC ................................ 60/398; 290/1 D, 43, 54
See application file for complete search history.

(56) References Cited

U.S. PATENT DOCUMENTS

| | | | |
|---|---|---|---|
| 3,866,396 A * | 2/1975 | Meyer | A01D 44/00 |
| | | | 56/9 |
| 4,408,452 A | 10/1983 | Tsunoda | |
| 6,114,773 A | 9/2000 | Kouris | |
| 6,833,631 B2 | 12/2004 | Van Breems | |
| 6,982,498 B2 | 1/2006 | Tharp | |
| 6,995,479 B2 | 2/2006 | Tharp | |
| 6,998,730 B2 | 2/2006 | Tharp | |
| 7,042,114 B2 | 5/2006 | Tharp | |
| 7,281,371 B1 | 10/2007 | Heidenreich | |
| 7,352,074 B1 | 4/2008 | Pas | |
| 7,470,086 B2 | 12/2008 | Jennings et al. | |
| 7,471,009 B2 | 12/2008 | Davis et al. | |
| 7,728,454 B1 | 6/2010 | Anderson, Jr. | |
| 7,911,073 B2 | 3/2011 | Smith | |
| 7,911,074 B2 | 3/2011 | Anderson | |
| 7,915,750 B1 | 3/2011 | Rovinsky | |
| 7,938,622 B2 | 5/2011 | Anderson, Jr. | |
| 7,980,832 B2 | 7/2011 | Ahdoot | |
| 8,022,567 B2 | 9/2011 | Davis et al. | |
| 8,164,209 B2 | 4/2012 | Rovinsky | |
| 8,166,760 B2 | 5/2012 | Fiske | |
| 8,174,135 B1 | 5/2012 | Roe et al. | |
| 8,215,104 B2 | 7/2012 | Riley | |
| 8,350,396 B2 | 1/2013 | Dempster | |
| 8,362,631 B2 | 1/2013 | Roe et al. | |
| 8,424,300 B1 | 4/2013 | Navarro | |
| 8,446,032 B2 | 5/2013 | Chauvin | |
| 8,456,031 B1 | 6/2013 | Hull et al. | |
| 8,497,594 B2 | 7/2013 | Rajadhyaksha et al. | |
| 8,525,363 B2 | 9/2013 | Rajadhyaksha et al. | |
| 8,536,723 B2 | 9/2013 | Roos | |
| 8,558,403 B2 | 10/2013 | Rooney | |
| 8,692,404 B2 | 4/2014 | Chauvin | |
| 8,698,338 B2 | 4/2014 | Slocum et al. | |
| 8,737,558 B2 | 5/2014 | Fiske | |
| 8,749,086 B2 | 6/2014 | Nanayakkara et al. | |
| 8,786,122 B2 * | 7/2014 | Rajadhyaksha | F03B 17/063 |
| | | | 290/53 |

| | | | |
|---|---|---|---|
| 8,928,168 B2 | 1/2015 | Letang | |
| 8,963,356 B2 | 2/2015 | Roos | |
| 8,966,899 B2 | 3/2015 | Fiske | |
| 8,987,932 B2 | 3/2015 | Nanayakkara et al. | |
| 9,022,692 B2 | 5/2015 | Frazier et al. | |
| 9,038,377 B2 | 5/2015 | Anteau | |
| 9,041,235 B1 * | 5/2015 | Hunter | F03B 17/061 |
| | | | 290/54 |
| 9,051,914 B1 | 6/2015 | Hanna | |
| 9,127,639 B2 | 9/2015 | Cho et al. | |
| 9,139,974 B2 | 9/2015 | Frazier et al. | |
| 9,151,269 B2 | 10/2015 | Han | |
| 9,234,437 B1 | 1/2016 | Hanna | |
| 9,234,494 B2 | 1/2016 | Anteau | |
| 9,234,495 B2 | 1/2016 | Anteau | |
| 9,249,783 B2 | 2/2016 | Selsam | |
| 9,441,606 B2 | 9/2016 | Hanna | |
| 9,453,492 B2 | 9/2016 | Letang | |
| 9,476,401 B2 | 10/2016 | Han | |
| 9,556,848 B2 | 1/2017 | Lin et al. | |
| 9,581,127 B2 | 2/2017 | Van Rompay | |
| 9,797,366 B2 | 10/2017 | Schmidt-Boecking et al. | |
| 10,024,307 B2 | 7/2018 | Selsam | |
| 10,054,103 B2 | 8/2018 | Lin et al. | |
| 10,344,741 B2 | 7/2019 | Sant et al. | |
| 10,364,938 B2 | 7/2019 | Frazier et al. | |
| 10,385,858 B2 | 8/2019 | Haddad | |
| 10,473,084 B2 | 11/2019 | Van Rompay | |
| 10,648,446 B2 | 5/2020 | Kouris | |
| 10,774,806 B1 | 9/2020 | Lu | |
| 10,871,149 B2 | 12/2020 | Selsam | |
| 10,941,747 B1 | 3/2021 | Bingaman | |
| 11,018,554 B2 | 5/2021 | Vannan, Jr. et al. | |
| 12,085,053 B2 * | 9/2024 | Smith | F03B 13/264 |
| 2005/0001432 A1 * | 1/2005 | Drentham Susman | |
| | | | F03B 13/266 |
| | | | 290/43 |
| 2008/0309089 A1 * | 12/2008 | Lin | F03D 3/067 |
| | | | 290/54 |
| 2009/0146422 A1 * | 6/2009 | Srybnik | F03B 1/04 |
| | | | 290/43 |
| 2009/0196769 A1 | 8/2009 | Davis, Sr. | |
| 2009/0230687 A1 | 9/2009 | Robichaud | |
| 2009/0309366 A1 | 12/2009 | Moore | |
| 2010/0007148 A1 | 1/2010 | Davis et al. | |
| 2010/0072754 A1 | 3/2010 | Huang | |
| 2010/0117364 A1 | 5/2010 | Harrigan | |
| 2010/0158705 A1 | 6/2010 | Guinard | |
| 2010/0207394 A1 | 8/2010 | Leung | |
| 2010/0258449 A1 * | 10/2010 | Fielder | F03B 17/061 |
| | | | 204/278 |
| 2011/0018277 A1 | 1/2011 | Brace | |
| 2011/0101697 A1 | 5/2011 | Power, III et al. | |
| 2011/0204627 A1 | 8/2011 | Ho et al. | |
| 2011/0260460 A1 | 10/2011 | Rovinsky | |
| 2011/0291419 A1 | 12/2011 | Dunne et al. | |
| 2012/0286508 A1 | 11/2012 | Poddey | |
| 2013/0043681 A1 | 2/2013 | Rivera | |
| 2013/0199182 A1 | 8/2013 | Shifferaw | |
| 2013/0200622 A1 | 8/2013 | Shifferaw | |
| 2013/0307272 A1 | 11/2013 | Smith | |
| 2014/0028028 A1 * | 1/2014 | Frye | F03B 17/06 |
| | | | 290/54 |
| 2014/0219800 A1 | 8/2014 | Lee | |
| 2014/0306454 A1 | 10/2014 | Lin et al. | |
| 2015/0014995 A1 | 1/2015 | Nishioka | |
| 2015/0033722 A1 | 2/2015 | Layton et al. | |
| 2015/0048619 A1 | 2/2015 | Lin et al. | |
| 2015/0198137 A1 | 7/2015 | Hanna | |
| 2015/0292471 A1 | 10/2015 | Kithil et al. | |
| 2015/0354528 A1 * | 12/2015 | Van Rompay | F03B 13/10 |
| | | | 290/54 |
| 2016/0084219 A1 | 3/2016 | Owen | |
| 2016/0160835 A1 | 6/2016 | Abu-Al-Rubb | |
| 2016/0237983 A1 | 8/2016 | Hayman | |
| 2018/0010569 A1 | 1/2018 | Lin et al. | |
| 2018/0355835 A1 | 12/2018 | Lee | |
| 2019/0085814 A1 | 3/2019 | Bee | |

(56)      References Cited

U.S. PATENT DOCUMENTS

| | | | |
|---|---|---|---|
| 2020/0063708 A1 | 2/2020 | Grigg | |
| 2020/0095985 A1 | 3/2020 | Anteau | |
| 2021/0071632 A1 | 3/2021 | Gudesen | |
| 2021/0148327 A1 | 5/2021 | Anteau | |
| 2022/0060009 A1* | 2/2022 | Godreau | .................. H02G 9/12 |
| 2023/0304466 A1 | 9/2023 | Smith | |

OTHER PUBLICATIONS

International Search Report and Written Opinion mailed Nov. 17, 2021 for International Application Serial No. PCT/US2021/045605 filed on Aug. 11, 2021.
U.S. Appl. No. 19/211,029, filed May 16, 2025.
U.S. Appl. No. 19/224,562, filed May 30, 2025.

* cited by examiner

314C

514

314B

314A

314D

SYSTEMS AND METHODS FOR POWER DISTRIBUTION AND HARNESSING OF MARINE HYDROKINETIC ENERGY

RELATED APPLICATIONS

This application is a continuation of U.S. patent application Ser. No. 17/846,779 filed on Jun. 22, 2022, which claims priority from U.S. Prov. App. No. 63/213,332 filed on Jun. 22, 2021 and U.S. Prov. App. No. 63/220,826 filed on Jul. 12, 2021, the entirety of each of which is incorporated herein by reference.

FIELD

This invention generally relates to power systems and more particularly to power take off (PTO) systems and methods for harnessing marine hydrokinetic energy.

BACKGROUND

Power generation and energy storage technologies are continuously evolving to accommodate our ever increasing demand for electricity.

Some power systems rely on non-renewable energy sources, such as coal, natural gas, nuclear fuel, petrochemicals, and other fuels, to generate a predictable amount of power when needed by increasing or decreasing the amount of fuel input into the system according to energy demand at any given time. However, such power systems may also be associated with significant or unpredictable financial costs (e.g., due to fuel market price fluctuations, fuel extraction and mining costs, etc.) as well as environmental costs (e.g., carbon emissions, damage caused by mining operations, etc.).

Some power systems mitigate or avoid these disadvantages by instead relying on renewable energy sources, such as solar energy (e.g., solar cell systems), wind energy (e.g., wind turbine systems), etc., which are generally more abundant and can usually be harvested without causing as much damage to the environment compared to fuel sources. However, there are also other technical challenges associated with harnessing renewable energy efficiently. For example, some renewable energy systems passively collect energy at less predictable times and/or rates depending on the current state of their surrounding environment. For instance, power output by a solar power system (e.g., photovoltaic cells) or a wind power system at any given time will vary depending on the current weather conditions (e.g., cloudy vs. clear sky, local wind speeds, etc.) in their surrounding environment.

Hydrokinetic energy is another type of renewable energy source, and is generally the energy that drives the movement of bodies of water. Tides, waves, ocean currents, and free-flowing rivers contain vast amounts of largely untapped, powerful, and clean hydrokinetic energy. Natural bodies of water can store immense amounts of hydrokinetic energy over time due to the thermal energy of the sun's heat and the mechanical energy exerted by the gravitational pull of the moon and the sun.

Traditional hydropower systems can sometimes be used to generate electricity efficiently (when needed). For example, a river can be dammed to accumulate the hydrokinetic energy of its flowing water by filling a reservoir behind the dam to convert it into potential energy. The stored water can then be released from the reservoir selectively (when needed) through a water turbine in a controllable manner (e.g., by controlling the rate of water flow through the water turbine) to generate an electricity signal having desired characteristics. However, hydropower dams may be less suitable or practical in some geographic locations (e.g., where there is no nearby river, or when the surrounding terrain is not ideal for damming a deep reservoir). Additionally, damming a river may sometimes result in other types of environmental harm, safety risks (e.g., flooding, etc.), and/or interfere with the use of the adjacent lands. Moreover, such traditional inland hydropower systems may not be suitable for harnessing the even more massive amounts of hydrokinetic energy stored in other bodies of water, such as oceans and seas.

The present disclosure is directed to power systems that provide significant advantages and capabilities over prior art power systems of the type discussed above.

SUMMARY

The present disclosure provides systems, methods, and apparatus that enable generating, storing, and/or transferring power efficiently by way of harnessing hydrokinetic energy from marine environments.

In an example, a system is provided that comprises an enclosure configured to be submerged in a body of water. The system also comprises a capture device coupled to the enclosure. The capture device includes a rotor shaft and a plurality of blades coupled to the rotor shaft. The plurality of blades are arranged to receive a flow of water when the enclosure is submerged in the body of water. The flow of water causes the plurality of blades to rotate the rotor shaft. The system also comprises a transfer device extending lengthwise from a first end to a second end of the transfer device. The transfer device is mechanically coupled to the capture device at the first end and configured to transfer a torque of the rotating rotor shaft from the first end to the second end. The second end is located outside the enclosure.

Additional features and advantages of the disclosed systems, apparatus, and methods are described in, and will be apparent from, the following Detailed Description and the Figures. The features and advantages described herein are not all-inclusive and, in particular, many additional features and advantages will be apparent to one of ordinary skill in the art in view of the figures and description. Also, any particular embodiment does not have to have all of the advantages listed herein. Moreover, it should be noted that the language used in the specification has been principally selected for readability and instructional purposes, and not to limit the scope of the inventive subject matter.

DETAILED DESCRIPTION

Figure 1:
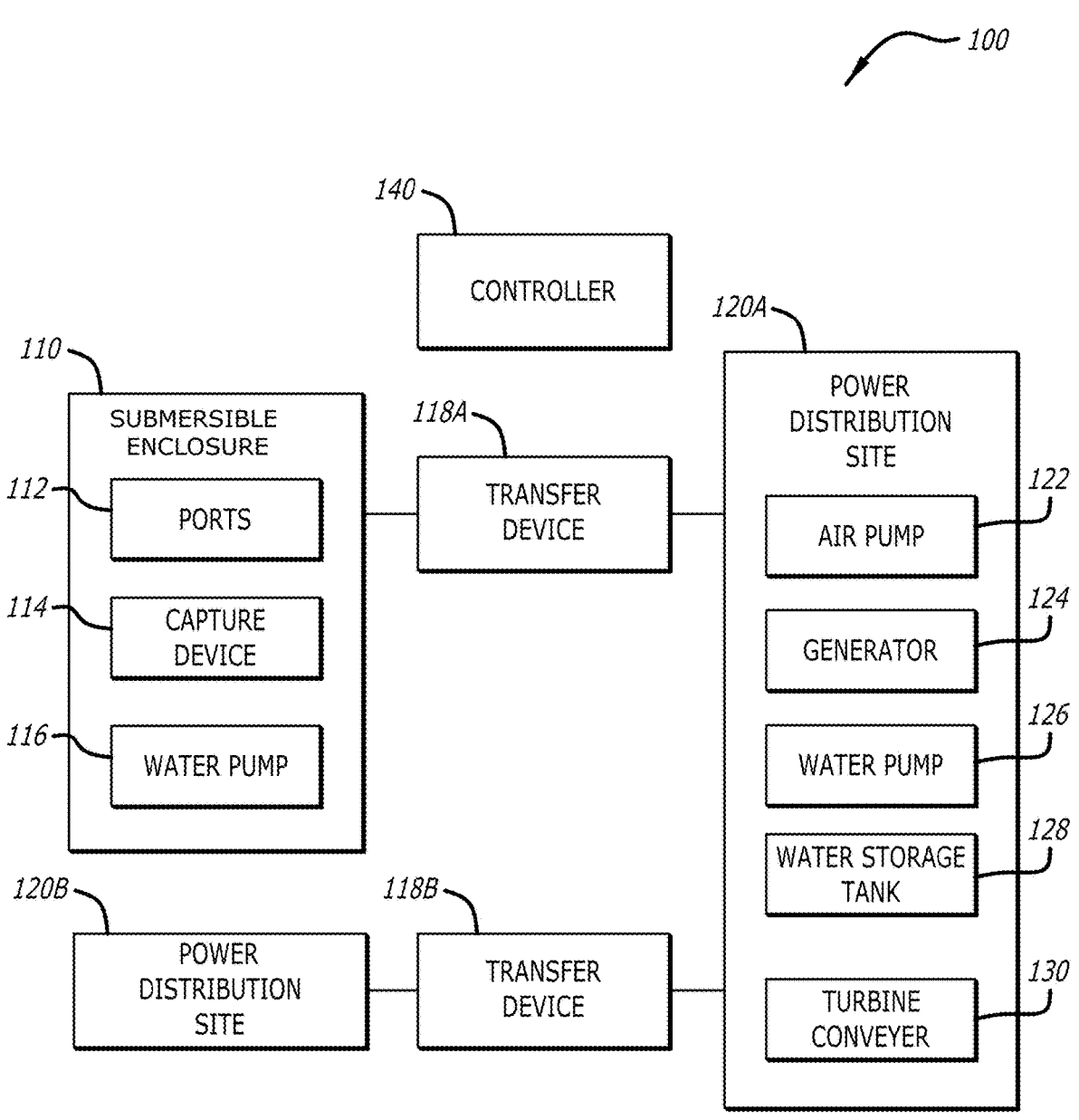
FIG. 1 is a block diagram of an example power system, according to an example embodiment of the present disclosure.

Oceans and seas have vast amounts of untapped hydrokinetic energy, including tidal energy sufficient to drive massive tidal waves across our planet every day and other types of water currents. Oceans also store huge amounts of gravitational potential energy as evidenced by the immense pressures in deep ocean waters. For example, water pressures at the average ocean depth of about 12,100 feet can be approximately 5,239 pounds per square inch (PSI). As another example, some oil industry rigs deployed today include: Auger Platform, seabed depth 2,720 feet, ocean pressure 1,177 PSI; Mars Platform, seabed depth 2,940 feet, ocean pressure 1,273 PSI; Horn Mountain Platform, seabed depth 5,422 feet, ocean pressure 2,347 PSI; Perdido Platform, seabed depth 8,040 feet, ocean pressure 3,481 PSI. In general, seabed or ocean floor underwater pressures at many different locations are suitable for various applications of the example power systems of the present disclosure.

However, in some applications, it may desirable for hydropower generated at a given location (e.g., sea bed, etc.) to be delivered to a remote site. Furthermore, in some scenarios, power consumption sites may be near a shallow water body (e.g., river bed, etc.) at which a desired amount of hydropower may not always be available.

Accordingly, the present disclosure includes example systems and methods for harnessing and distributing marine hydrokinetic energy to enable or improve various power applications (e.g., power generation, power conversion, power distribution, energy storage, etc.). The systems and methods described herein are not limited to harnessing energy at ocean depths, but can also include harnessing energy at depths of other bodies of water such as, but not limited to, rivers, seas, lakes, etc.

FIG. 1 is a block diagram of an example embodiment of a power system 100, according to the present disclosure. In the illustrated example, the system 100 includes a submersible enclosure 110, transfer devices 118A-B, power distribution sites 120A-B, and a controller 140.

The enclosure 110 defines a sealed low pressure environment (e.g., air, vacuum, etc.) configured to be submerged in a water body, optionally at various depths, such that water pressure outside the enclosure 110 is substantially greater than inside the enclosure. In some examples, the enclosure 110 has a spherical shape, a cylindrical shape, or any other shape suitable to withstand a pressure differential between water surrounding the enclosure 110 (e.g., when submerged underwater) and the low pressure environment inside the enclosure 110.

In some examples, the enclosure 110 can be a self-contained module of the system 100. For example, the enclosure 110 can be configured as an underwater power plant. To that end, in some examples, the system 100 may include more than one enclosure 110 (i.e., underwater power plant) at different locations and/or depths that generate power for one or more power distribution sites 120A, 120B, etc. In some examples, enclosure 110 is mounted to a seabed. In other examples, the enclosure 110 is deployed at a different depth between the seabed and the surface of the body of water in which the enclosure 110 is submerged. In some examples, the enclosure 110 may include compressed air storage tanks, water storage tanks, or any other component required to operate the enclosure 110 as a submarine, such as ballast tank(s), variable ballast tank(s), trim tank(s), vent valve(s), a pressure hull, computers, and/or any other component suitable for operating the enclosure 110 as a remotely piloted submarine. In an example, the enclosure 110 may be operated remotely (e.g., using the controller 140) to move the enclosure to different sea levels, depths, and/or locations.

In some examples, the enclosure 110 can include one or more compartments, and each compartment can be pressurized or non-pressurized.

In some examples, the system 100 includes more than one enclosure 110 submerged in the same body of water or in different bodies of water. For example multiple enclosures 110 may be arranged at different positions relative to one another (e.g., near factories, cities, etc.) and/or at different depths (e.g., deep water locations, shallow water locations, etc.).

In the illustrated example, the enclosure 110 includes a plurality of ports 112, a capture device 114, and a water pump 116.

The plurality of ports 112 may be disposed along a periphery of the enclosure 110 to define channels through which water (or air) can flow into or out of the enclosure 110. To that end, in various examples, a port 112 may include a valve (e.g., pressure valve, a vent valve, etc.), a nozzle, a waterjet, a water regulator, combinations thereof, and/or any other component that is operable to allow, prevent, or control a flow of water into or out of the enclosure 110 via the port. For example, a valve 112 can be used to increase or decrease the flow of water transported into or out of the enclosure 110 by at least partially closing or opening the valve. In some examples, one or more ports 112 are intake port(s) 112 or inlet(s) 112 that transport water, compressed air, or any other fluid into the enclosure 110. In some examples, one or more ports 112 are discharge port(s) 112 or outlet(s) 112 that transport water, air, or any other fluid out of the enclosure 110.

In some examples, the plurality of ports 112 are arranged at different positions along the periphery of the enclosure 110 and/or oriented in a plurality of directions relative to a body of water surrounding the enclosure 110. For example, where the enclosure 112 has a spherical shape, each port 112 may transport water from a different direction relative to the body of water (in which the enclosure 110 is submerged) depending on the relative position of the port.

Thus, in some examples, the ports 112 include one or more intake valves, outlet valves, or a combination thereof. In some examples, the ports 112 include water intake valves, water outlet valves, air intake valves, air outlet valves, or a combination thereof. In examples, the valves can be Penstock Pipe or composed of a Penstock type pipe. In other examples, on/off stop valves 112 can be placed near intake valves, outlet valves, or a combination thereof.

In some examples, although not shown, a turbine generator may be disposed inside the enclosure (e.g., in the low pressure environment) and coupled to an intake port 112 to receive water entering the enclosure 110 through the intake port. The received water may flow through the turbine to cause the turbine to generate power (e.g., by rotating turbine blades, etc.). A non-exhaustive list of possible example turbine generators that can be employed in the system 100 includes a Francis turbine, a Pelton turbine, a Kaplan turbine, a Deriaz turbine, a Jonval turbine, a Cross turbine, a reaction type turbine, an impulse type turbine, or any other type of turbine. The turbine generator can be mounted vertically, horizontally, or in any suitable orientation depending on an application of the system 100.

Alternatively or additionally, as shown in the illustrated example, the enclosure 100 may include a capture device 114. The capture device 114 may include, for example, a plurality of blades (not shown) coupled to one or more rotor shafts so as to rotate the rotor shaft(s) when a stream of water flows across and/or pushes the blade(s). In this example, instead of or in addition to converting the torque of the rotor shaft(s) into electrical power using a local generator (e.g., turbine), the capture device 114 may be mechanically coupled to a first end of a transfer device 118A to transfer the torque of the rotating rotor shaft/capture device 114 through the transfer device 118A to a remote power distribution site 120A at a second end of the transfer device 118A.

To that end, in examples, the transfer device 118 extends lengthwise from the first end (located at or near the enclosure 110) to the second end (located at or near the site 120A). In an example, the transfer device 118A may be implemented as a pipe or a series of connected pipes (not shown). Each pipe may house a shaft and one or more gears assembled to collectively transfer the torque of the rotor shaft from the capture device 114 to the site 120A. In alternate or additional examples, the transfer device 118A includes a flexible cable in which a wire (e.g., auger wire) is disposed. For example, the wire may rotate to transfer the torque from the first end of the flexible cable 118A (connected to the capture device 114) to the second end of the flexible cable 118A (connected to the site 120A).

The transfer device 118B may be similar to the transfer device 118A and may be configured to transfer at least a portion of the torque (generated at the capture device 114) from the power distribution site 120A to the power distribution site 120B. In examples, the enclosure 110 and the sites 120A-B may be geographically distributed in different locations and may potentially be separated by any suitable distance (e.g., 10s or 100s of miles). Thus, the transfer devices 118A-B may enable transferring power, mechanically and efficiently, between different locations of various submerged enclosures (e.g., 110) and/or power distribution sites (e.g., 120A, 120B) in the system 100. In some applications, mechanically transferring power between different locations in accordance with the present disclosure may advantageously reduce or avoid the costs and/or technical drawbacks of other potential alternatives methods, such as electrical power transmission methods (e.g., which may be expensive and/or susceptible to electrical transmission losses, power conversion electronics losses, electromagnetic noise and/or interference, etc.).

The water pump 116 may be optionally included in the enclosure 110 to selectively adjust (e.g., increase) the pressure of the water flowing to the capture device 114. In one non-limiting example, the water pump 116 may be configured to increase the pressure of the water flowing toward the capture device from a range of 1000-3000 PSI to a range of 5000-15000 PSI. A non-exhaustive list of example water pumps 116 that can be employed in the system 100 may include turbopumps, hydraulic pumps, pneumatic pumps, or any other type of water pump. For instance, the water pump 116 can enable the system 100 to adjust or increase the torque output from the capture device 114 to the transfer device 118A depending on current power needs of loads served by the power distribution site 120A near the enclosure 110, and/or any other relevant factor.

In an example, the water pump 116 may be powered using the torque of another rotor shaft driven by the capture device 114. In another example, the water pump 116 may be powered using torque from a second capture device (not shown) similar to the capture device 114 (e.g., another rotor shaft driven by another stream of water entering the enclosure from a different port 112, etc.) inside the enclosure 110. In another example, the water pump 116 may be powered using torque from transferred into the enclosure 110 from an external source (e.g., a different enclosure, a power distribution site 120A, 120B, etc.). In another example, the water pump 116 may be powered by electric power (e.g., generated inside the enclosure 110 or received from an external site 120A, 120B, etc.). In another example, the water pump 116 may be powered by a different power source (e.g., gas turbine, combustion engine, etc.).

The power distribution sites 120A-B may be separated from the enclosure 110 and/or may be in different geographic locations. In examples, the power distribution sites 120A-B are located outside the body of water in which the enclosure 110 is submerged. For example, the power distribution sites 120A-B may be disposed in an ocean vessel on a surface of the body of water, or may include land-based sites (e.g., land based power plants, etc.). In some examples, the power distribution sites 120A-B may be connected to an electricity grid (e.g., utility grid, microgrid, etc.) and configured to condition and integrate (e.g., adjust voltage levels, frequencies, modulation, etc.) generated electrical power (e.g., from generator 124 or enclosure 110) into the electricity grid.

In the illustrated example, power distribution site 120A includes an air pump 122, a generator 124, a water pump 126, a water storage tank 128, and a turbine conveyer device 130. Power distribution site 120B may be similar to site 120A, but may be at a different geographic location.

The air pump 122 may include any type air compressor configured to compress air (e.g., from the surrounding environment). In some examples, the system 100 is configured to send the compressed air from the air pump to one or more submerged enclosures (e.g., 110, etc.) to adjust a pressure of water flowing to the capture device 114. For example, the compressed air from the air pump 122 can be used to power the water pump 116 (and thus increase the pressure of the stream of water flowing to the capture device 114). In an example, the air pump 122 may be powered using torque received from a power take off (PTO) device such as the transfer device 118A (e.g., torque generated in the enclosure 110 or other enclosures connected to the site 120A). In an example, the air pump 122 is powered using electrical power, which may be sourced from an electricity grid (not shown) connected to the site 120A, generated by the generator 124, received from a different power distribution 120B, or received from a submerged enclosure (e.g., 110, etc.).

The generator 124 may be a turbine generator or any other type of generator disposed inside or near the site 120A. In examples, the generator 124 uses at least a portion of the torque transferred via the transfer device 118A to generate electrical power. In an example, the generator 124 is disposed outside the body of water (in which the enclosure 110 is submerged) and is mechanically coupled to the second end of the transfer device 118A (at which the torque from the captured device 114 is delivered) to generate power at a different geographic location using the torque that was generated in the submerged enclosure 110 and/or one or more other submerged enclosures which may be at various distant locations. A non-exhaustive list of possible implementations of the example generator 124 includes a Francis turbine, a Pelton turbine, a Kaplan turbine, a Deriaz turbine, a Jonval turbine, a Cross turbine, a reaction type turbine, an impulse type turbine, any other type of turbine generator, an electric motor generator, or any other type of generator. The generator 124 can be mounted vertically, horizontally, or in any other suitable orientation.

As noted above, in some examples, the system 100 is configured to mechanically transfer power generated at a source location (e.g., the enclosure 110) to more than one destination (e.g., generators, buildings, power distribution sites, power plants, electric vehicles, ocean vessels, etc.). To facilitate this, in the illustrated example, the power distribution site 120A includes the water pump 126, the tank 128, and the turbine conveyer 130.

The water pump 126 may include a hydraulic pump, a pneumatic pump, a turbopump, or any other type of pump. In an example, the water pump 126 is configured to compress or pressurize water from the water storage tank 128 into a high pressure water stream (e.g., 5000 to 15000 PSI or any other suitable high pressure). To facilitate this, the water pump 126 can be powered using torque (i.e., power take off (PTO) method) transferred into the site 120A from an external source (e.g., torque transferred from the enclosure 110 through the transfer device 118A) or from an internal source (e.g., from the turbine conveyer 130 or any other component in the site 120A that generates torque). Alternatively or additionally, in some examples, the water pump 126 can be powered using an electrical motor or a gas turbine or a combustion engine or any other type of motor. In some examples, the water pump 126 can alternatively or additionally be powered by a battery or a battery bank.

The water storage tank 128 may be a pressurized or unpressurized local water storage tank. For example, where the site 120A is located on an sea surface vessel (e.g., ship, boat), a coastal land location, or other land location with access to unpressurized water, the water storage tank can store unpressurized water from its local water source. In an alternative example where the site 120A is near, at, or at least partially submerged in water (e.g., lake or river bed or at different ocean depth), the tank 128 may store pressurized water which may be at a lower or higher pressure than the pressurized water flowing into the enclosure 110.

The turbine conveyer 130 may include a conveyer belt (not shown) on which a plurality of blades (not shown) are disposed to rotate the conveyer belt when a pressurized stream of water (e.g., pumped by the water pump 126) flows across (e.g., above or under) the conveyer belt. The conveyer belt may in turn be coupled to one or more rotor shafts (not shown) and configured to rotate each of the rotor shaft(s)

about its axis by transferring the force from the stream of water to the rotor shaft(s) disposed in the turbine conveyer device 130. In an example, torque from one or more of the rotor shafts in the turbine conveyer 130 may then be transferred, via the transfer device 118B, out of the site 120A to a different power distribution site 120B. In some examples, torque from one or more other rotor shafts in the turbine conveyer 130 can be used to power other components at or near the site 120A (e.g., the air pump 122, the generator 124, the controller 140, or other electronics (not shown) at or near the site 120A).

The controller 140 is configured to control various components of the system 100. In examples, the controller 140 is configured to regulate and/or control the flow of water into and/or out of the enclosure 110, the amount of torque transferred between the enclosure 110 and the distribution sites 120A-B, and/or the amount of torque used to power certain components (e.g., generators 124, air pumps 122, water pumps 116, 126, etc.) at or near each enclosure (e.g., 110) or distribution site (e.g., 120A-B) of the system 100. To that end, the controller 140 may include one or more computers that have hardware and/or software executable to control the system 100 in accordance with the present disclosure. For example, the computer 140 may include one or more processors and a memory device (e.g., a nontransitory computer readable medium) storing instructions that, when executed by the one or more processors, cause the computer(s) 140 to perform the functions described herein. Alternatively or additionally, the controller 140 may include digital and/or analog circuitry wired to perform the functions of the controller 140 described herein. In some examples, the controller 140 may be disposed at any of the sites 120A, 120B and/or enclosure(s) 110. In some examples, the controller 140 may have a distributed computing architecture comprising one or more computing systems connected via a network and/or distributed across one or more locations (e.g., sites 120A-B, enclosure 110, etc.) to collectively perform the functions disclosed herein.

The controller 140 may be configured to control flow of water into the enclosure 110 by operating an intake port 112 of the enclosure 110 (e.g., by switching an intake port or valve 112 to allow, prevent, or adjust the rate at which the water is flowing in). Similarly, the controller 140 may also be configured to control flow of water out of the enclosure 110. The controller 140 may also be configured to control the amount of torque transferred between various components of the system (e.g., enclosure 110, sites 120A-B, etc.), for example, by changing the number of rotor shafts connected to the transfer devices 118A, 118B.

Tidal waves generally have very long wavelengths (e.g., miles or tens or miles) such that, at any particular location in the ocean, high tides and low tides occur in a predictable manner (e.g., approximately every 6 hours, 12 hours, etc.). Thus, in examples where the system 100 is configured to harvest tidal energy, the controller 140 can start pumping and/or increase the rate at which water is being pumped out of the enclosure 110 during times when the tidal phase is at or near a low tide. Similarly, the controller 140 can start or increase the rate at which water is being transported into the enclosure 110 when the tidal phase is at or within a threshold from a high tide (e.g., when the sea level above the enclosure 110 is slightly higher than average due to the tidal forces exerted on the oceans by the moon and/or the sun. Thus, the example systems herein may advantageously enable harnessing tidal energy by selectively allowing water into the enclosure 110 and/or he storage tank 120 during high tides (when the water level is relatively higher), and/or by delaying the timing or rate of pumping water out of the water storage tank 120 until a low tide condition occurs (i.e., when the water level above the storage tank 120 is relatively lower) to harness the pressure differential between the high tide and the low tide. Notably, the example systems herein also advantageously improves the efficiency of harvesting tidal wave energy, by using the high pressure environment at the ocean depths to more effectively transport large amounts of water through the turbine 114 during the high tide phase. For example, if the turbine was instead closer to the surface of the body of water, a relatively smaller amount of water will flow through the turbine 114 during the high tide phase. Accordingly, the example systems herein provide a significant advantage over traditional systems by efficiently harnessing one of the relatively more challenging but very abundant sources of marine hydrokinetic energy.

Furthermore, as noted above, the system 100 may decouple the locations of devices that capturing marine hydrokinetic energy (e.g., by placing enclosures 110 in locations where strong water currents or suitable pressure differentials are expected, etc.) from locations of devices (e.g., generators, cities, factories, etc.) where mechanical power (e.g., rotor torques) is converted into electrical power by using PTO or torque transfer devices (e.g., 118A-B). Thus, the system 100 may advantageously allow transferring the captured kinetic energy from marine locations to a suitable destination mechanically, instead of or in addition to transferring it in the form electrical power using long electrical cables which may be susceptible to electrical power transmission losses, power conversion losses, electromagnetic interference, environmental noise emissions, etc., or may otherwise be less suitable for certain applications (e.g., where government regulations restrict deployment of high power electrical lines, where power line transmission/conversion losses may be too high, etc.).

In some embodiments, the system 100 can be deployed at ocean depths far above a seabed or on the seabed. For instance, an enclosure (e.g., 110) can be tethered, via transfer devices (e.g., 118A-B) to power distribution centers (e.g., 120A-B), electrical grid(s), ocean vessel(s), rig(s), ship(s), boat(s), yacht(s), and/or vehicle(s) in order to deliver electrical energy.

In some embodiments, the enclosure 110 and/or the sites 120A-B can be configured as an ocean vessel including a propulsion system for navigation and positioning the enclosure 110 at sea depths. In some embodiments, the enclosure 110 can employ submarine components required to remotely pilot the enclosure 110 to a suitable location The suitable location, for example, can include, but is not limited to, land, or another part of the ocean. In other embodiments, the enclosure 110 can be deployed inside a vessel as an electric energy power source for the vessel. In some embodiments, the vessel can be a submarine.

In some embodiments, the system 100 includes cables. The cables can be submarine cables. In some embodiments, cables and submarine cables can be employed. The cables can deliver the electrical energy between the enclosure(s) 110 and/or the sites 120A-B. The electrical energy may include electrical power and/or signals for controlling the operation of various components of the system 100.

In some embodiments, the system 100 can include transformer(s), control room(s), computer(s) 140, and/or battery storage unit(s), or a combination thereof. In other embodiments, the systems can include transformer(s), control room(s), robotic(s), automation, computer(s) 140, and/or battery storage unit(s), or a combination thereof, whether within the system 100, outside the system 100, or near the system 100, or in the sea depths, or placed on land. In other embodiments, the system 100 can include accommodations for human habitation for periods of time, such as oxygen supply, sleeping quarters, kitchen, bathrooms, showers, storage area, living quarters, and is not limited to the list herein can be interchangeable and employed in the system 100.

It should be appreciated that the system 100 can alternatively include fewer or more components than those shown, and/or one or more of the components shown can be alternatively implemented as in a single or in different structures that perform the various functions of the one or more components.

For example, in various embodiments, the system 100 can comprise one or more enclosures 110, one or more vessels or power distribution centers 120A-B, one or more storage tanks 120, one or more intake valves 112, one or more outlet valves 112, one or more pressure valves, one or more turbine generators 114, one or more transmission gears, one or more water pumps 116, 126, one or more computers 140, one or more motors, electronics, mounts, and/or one or more air pumps 122. In some embodiments, the system 100 includes other hardware and/or software commonly used in marine hydrokinetic electrical energy systems.

As another example, the water pump 126, tank 128, and turbine conveyer 130 can be additionally or alternatively implemented in the power distribution site 120B, the enclosure 110, or as an independent power distribution module positioned in a location suitable for dividing harvested hydrokinetic energy (e.g., captured from a water current) into one or more PTO torques to be transferred via one or more transfer devices (e.g., 118A-B) and/or delivered to one or more nearby generators (e.g., 124), electric motors, pumps (e.g., 116, 126, 122), or to power any other machine at or near the location of such power distribution module.

Figure 2:
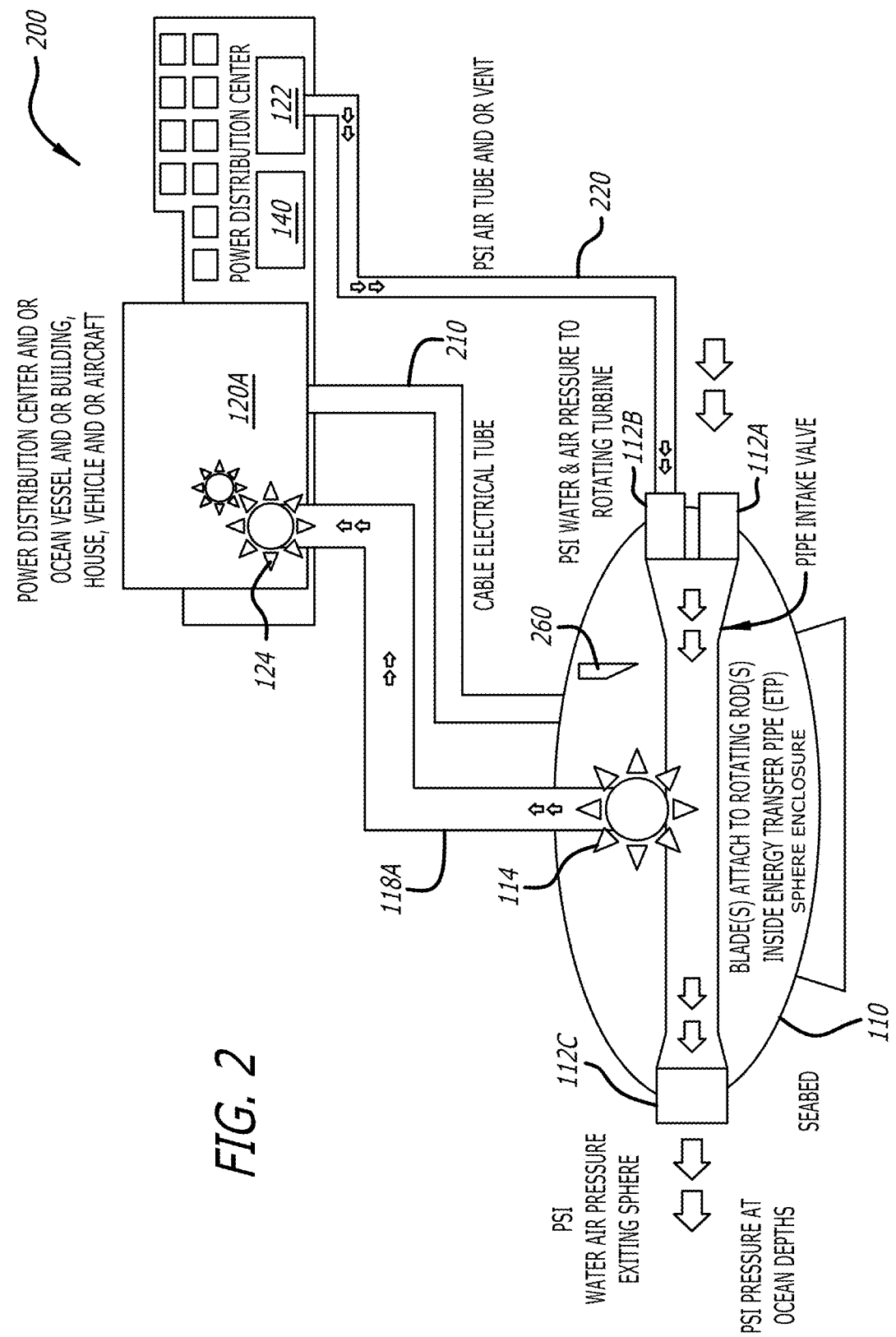
FIG. 2 illustrates an alternate embodiment of an example power system, according to the present disclosure.

FIG. 2 illustrates an alternate embodiment 200 of an example power system, according to the present disclosure.

In some embodiments, the enclosure 110 can have any shape, such as the shape shown in FIG. 2 or another shape, that concludes as a sealed device configured to prevent high pressure water and/or air from escaping, except through intake valves 112a, 112b or outlet valve 112c (collectively referred to as ports 112) that control flow of water and air into or out of the enclosure 110. In other embodiments, the enclosure 110 can have one or more compartments and options for smaller compartments. As shown, the capture device 114 is disposed inside the enclosure 110. In some examples, the enclosure 110 may also include one or more additional valve(s), gear boxes(s), power transmission, devices, computers, and/or other electronics required to operate the system 200. In the illustrated example, the enclosure 110 transports a high pressure water stream flowing to the capture device 114 so as to rotate blades of the capture device 114. As shown, the capture device 114 is coupled (e.g., via one or more rotating gears) to a first end of the energy transfer device 118A. The transfer device 118A may Include a first pipe extending lengthwise as illustrated in FIG. 2 in a first direction away from the first end (i.e., away from the capture device 114), a second pipe extending lengthwise in a second direction away from the first pipe, and so on.

In other embodiments, the enclosure 110 can optionally include one or more generators that generate electrical power, one or more valves and/or one or more gear boxes, and/or other electronics. The blades of the capture device 114 can be exposed to high pressure water flow to rotate a rotor shaft inside the enclosure 110. In some embodiments, the system 200 includes a tube 220 supplying high air pressure from vessel 230 to the enclosure 110. The air supply can be used to operate the enclosure 110 and regulate the proper pressure in the water flowing toward the capture device 114. In an example, the enclosure 110 can be deployed at 1,000 feet ocean depth and the PSI can be 433. In this example, a higher PSI may be necessary to get a to produce a desirable in the capture device 114. Thus, added air pressure (e.g., pumped by the air pump 122 via the tube 220) may be employed to increase the pressure of the water flowing to the capture device 114.

In some embodiments, high pressure water can enter the enclosure 110 through an intake valve 112a and rotate a rotor shaft of the capture device 114 to produce torque. The torque of the rotor shaft can then be sent to the power distribution center 120A for distribution to an electrical grid or to drive the generator 124. In other embodiments, a generator may be disposed inside the enclosure 110 and electrical power can be sent from the enclosure 110 to the site 120A (which is outside a body of water in which the enclosure 110 is submerged) by way of one or more electrical cables 210.

In some embodiments, the enclosure 110 can employ one or more stop valves 260 to be used as emergency turn on/off lever(s) controlling high pressure water flow. Thus, electricity can be produced at the generator 124 of the site 120A by transferring hydrokinetic energy obtained from water pressure at ocean depths in the enclosure 110 in the form a torque transferred to the generator 124 via the transfer device 118A (by rotating the turbine generator 124). Once high pressure water exits the enclosure 110 through the exit valve 112c, it can be released back into the body of water around the enclosure 110.

In some embodiments, the enclosure 110 can be mounted to the seabed (ocean floor) and/or tethered to a vessel 120A at the ocean's surface.

Enclosures 110 can be deployed in ocean(s), sea(s), river(s), lake(s), manmade lakes(s) and any body of water In some embodiments, sphere enclosures can operate in water depths and land holes filled with water at depths. In other embodiments, water pressure at ocean depths can be the main ingredient required to produce hydrokinetic electrical energy. The enclosure 110 can be composed of any suitable material used in the hydrokinetic energy industry. Water pressure, other liquids pressure, and/or pressurized air can be used for operations in the system 200. In some embodiments, the enclosure 110 can employ one or more motors with thrust propulsion used to maneuver the enclosure 110 into a proper position to operate at sea depths.

The enclosure 110 can employ one or more air tubes 220 from the enclosure 110 to the vessel or land-based platform 120A. The enclosure 110, in the illustrated example of FIG. 2, can produce electricity by way of hydrokinetics energy, obtained from water pressure at ocean depths. In some embodiments, the system 200 comprises the enclosure 110 with intake 112a for high pressure water to enter the enclosure 110. The flow of high pressure water can rotate a rotor shaft of the capture device 114, which can produce a torque and send it out of the body of enclosure 110 to the site 120A (which is outside the body of water). The site 120A can include, but is not limited to, an ocean surface vessel, a rig, a ship, a boat, a yacht, a vehicle, land, or a building. Then, in the site 120A, the torque transferred from the enclosure 118A (via the transfer device 118A) can be used to rotate the generator 124, and optionally one or more other components in or near the site 120A, such as the controller 140 or the air pump 122. In some embodiments, the power distribution center 120A can be on land. In some examples, the system 200 includes, but is not limited to, the enclosure 110, the turbine generator(s) 114, valve(s) 112, transmission gear(s), water pump(s) 122, air compressor(s) 119, storage tank(s) 120, ocean vessel(s) 230, computer(s) 140, motor(s) tube(s), cables, electronics, mounting apparatus, and tethering the unit and sensor(s).

In some examples, the system 200 can be designed to produce electricity offshore. For example, the power distribution site 120A can be alternatively configured as a long term ship/rig platform. One or many may be deployed as a part of an electricity producing farm at sea. Operation staff employees can work and live aboard the ship or rig 120A. The ship/rig 120A can be deployed miles offshore. The ship or rig can also be connected to a power distribution center on land and or designed to be a re-fueling, electric energy station for ocean going electric ships and vessels. In an example, the system 200 can be deployed along the world's coast and along ocean shipping routes as a re-fueling, electric energy station for ocean vessels, ships, aircraft and drones.

Figure 3:
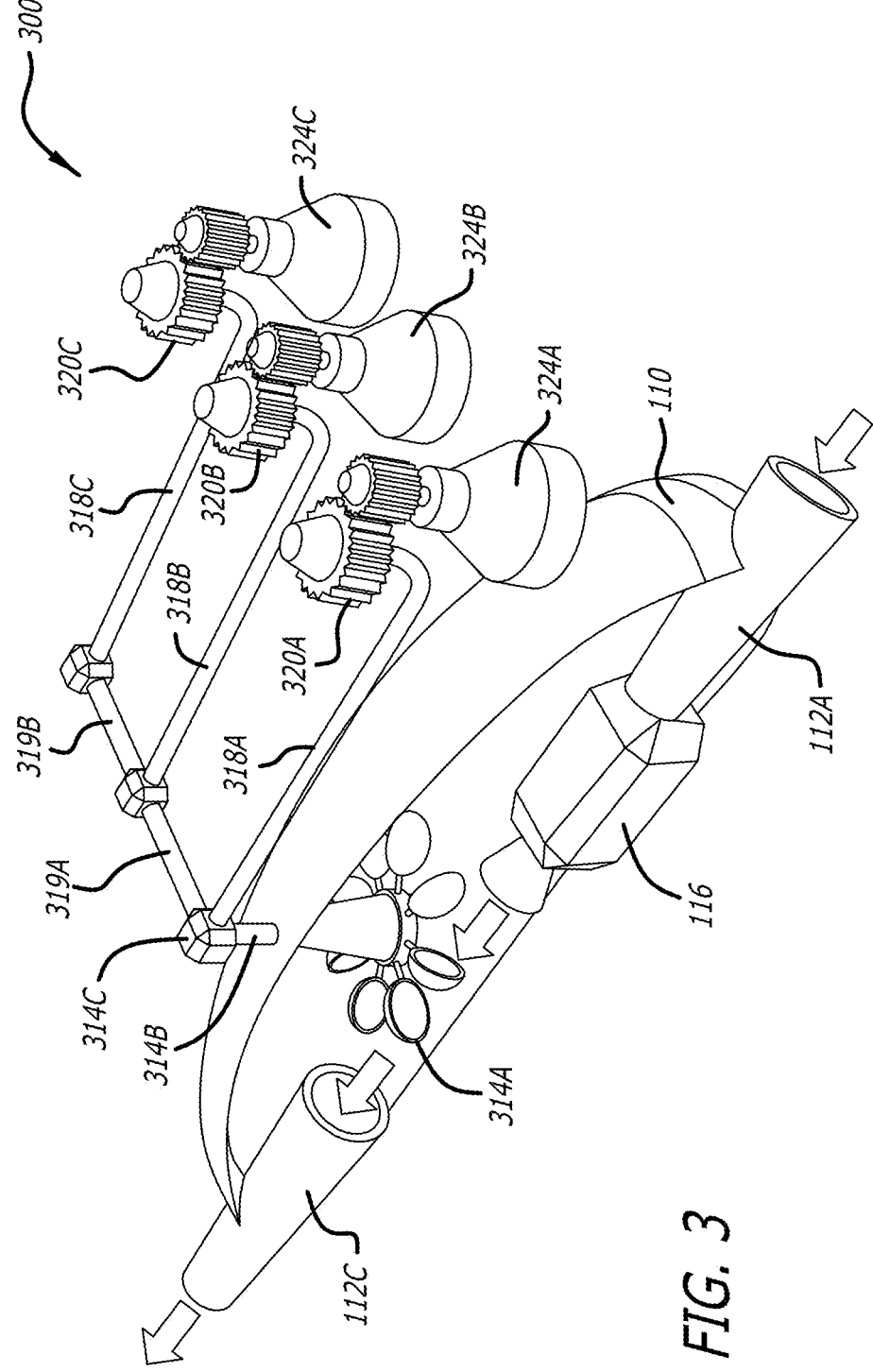
FIG. 3 is a partial illustration of another alternate embodiment of an example power system, according to the present disclosure.

FIG. 3 is a partial illustration of another alternate embodiment 300 of an example power system, according to the present disclosure. The system 300 comprises a sphere enclosure 110 or any shape enclosure 110 (a portion of which is omitted from FIG. 3 for illustrative purposes), which receives water through intake valve 112a and discharges water through outlet valve 112c. In the illustrated example, the system 300 also includes the water pump 116 disposed downstream of the intake valve 112a and configured to increase the pressure of the water flowing through the water pump 116.

In the illustrated example, the capture device 114 includes a plurality of blades 314a, a rotor shaft 314b and a joint or transmission gear(s) 314c. In an example, the plurality of blades 314a are coupled to the rotor shaft 314b so as to rotate the rotor shaft 314b when high pressure water flowing out of the water pump 116 moves across the plurality of blades 314b. The torque of the rotating rotor shaft 314b then rotates one or more gears inside the joint 314c (e.g., transmission gears), which then transfer the rotation torque of the rotor shaft 314b to one or transfer devices 318A-C (which are similar to transfer device 118A of the system 100). For example, the transfer device 318A may include a flexible cable that transfers torque received from the joint 314c at a first end of the transfer device 318A to a gear 320A at a second end of the transfer device 318A. In an example, the transfer device 318A may be implemented as a flexible cable, in which a wire rotates to transfer a first portion of the torque of the rotor shaft 314b from the first end to the second end.

In the illustrated example, a second portion of the torque of the rotor shaft 314b is transmitted, via a transfer pipe 319B, to a second transfer device 318B. For example, the pipe 319A may include a shaft disposed therein that rotates inside the pipe 319A to transfer the second portion of the torque from the joint 314c to the second transfer device 318B. A third portion of the torque of the rotor shaft 314b can similarly be transmitted, via the pipes 319A and 319B, to a third transfer device 318C. Each of the transfer devices 318A-C then transfers its respective portion of the torque to a different destination (e.g., different land based or surface based power distribution sites similar to the sites 120A-B of the system 100). For example, at the distal ends of each of the transfer devices 320A-C, a respective gear 320A-C may rotate according to the respective transferred portion of the torque of its device 320A-C. Thus, in the Illustrated example, the first portion of the torque is then transferred through the gear 320A to power or rotate a first generator 324A (similar to generator 124) at a first location. Similarly, the second portion of the transferred torque powers a second generator 324B at a second location, and the third portion of the torque powers a third generator 324C at a third location. It is noted that, in some examples, the generators 324A-C can be geographically distributed in distant locations potentially miles apart from one another and/or from the enclosure 110.

Figure 4:
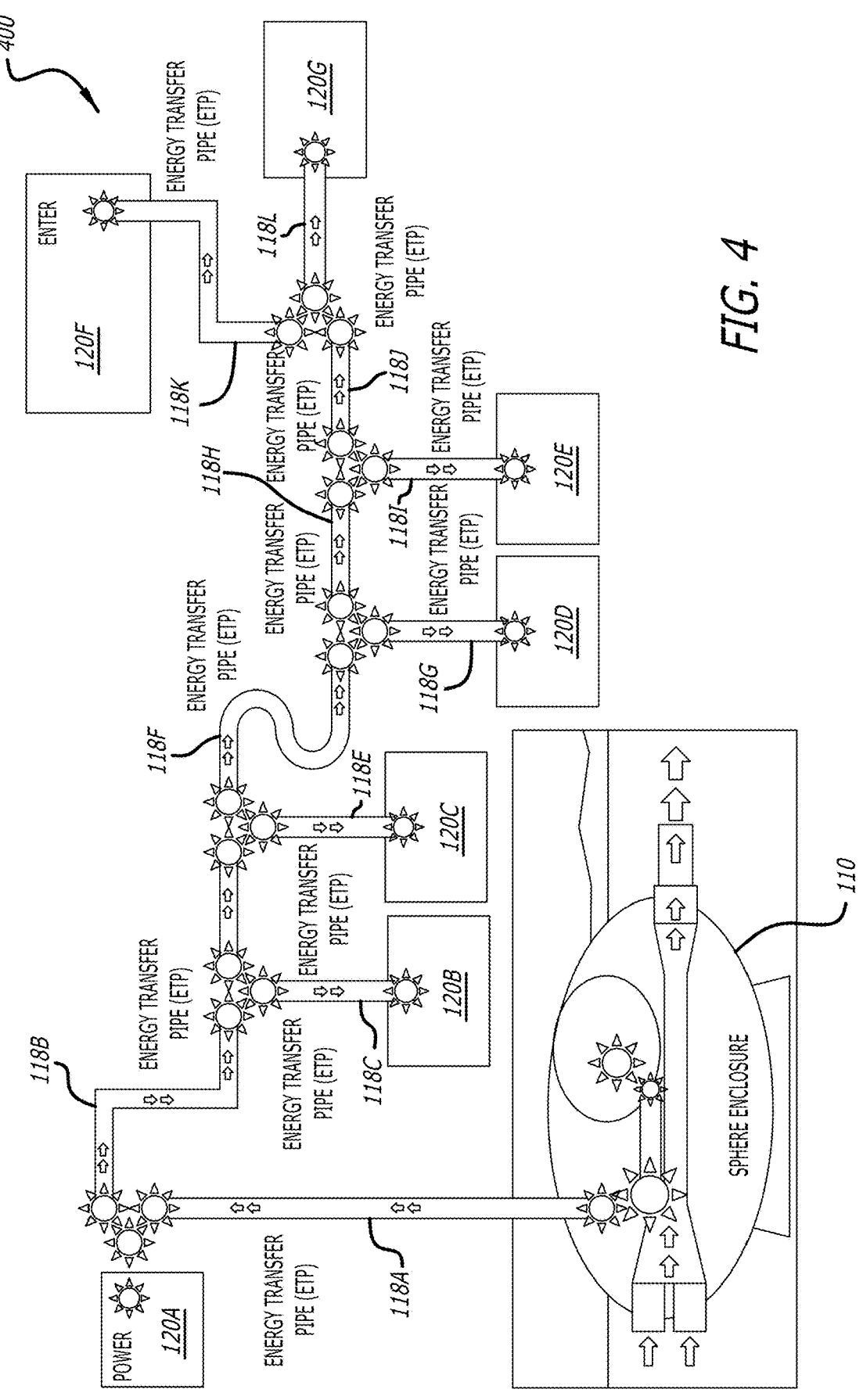
FIG. 4 illustrates another alternate embodiment of an example power system in which power is transferred to a plurality of distribution sites at different locations, according to the present disclosure.

FIG. 4 illustrates another alternate embodiment 400 of an example power system, according to the present disclosure. In the illustrated example, torque generated from the enclosure 110 is transferred, through a network of PTO devices or energy transfer devices 118A-L, to a plurality of different power distribution sites 120A-G that are geographically distributed in different locations. Thus, as noted above, hydrokinetic power captured at the enclosure 110 can be used to power various devices (e.g., generators, etc.) distributed across a plurality of different locations of the sites 120A-G. For example, a portion of the torque produced in the enclosure 110 can be transferred to the power distribution sight 120C via the transfer devices 118A, 118B, 118D, 118E, and so on.

Figure 5:
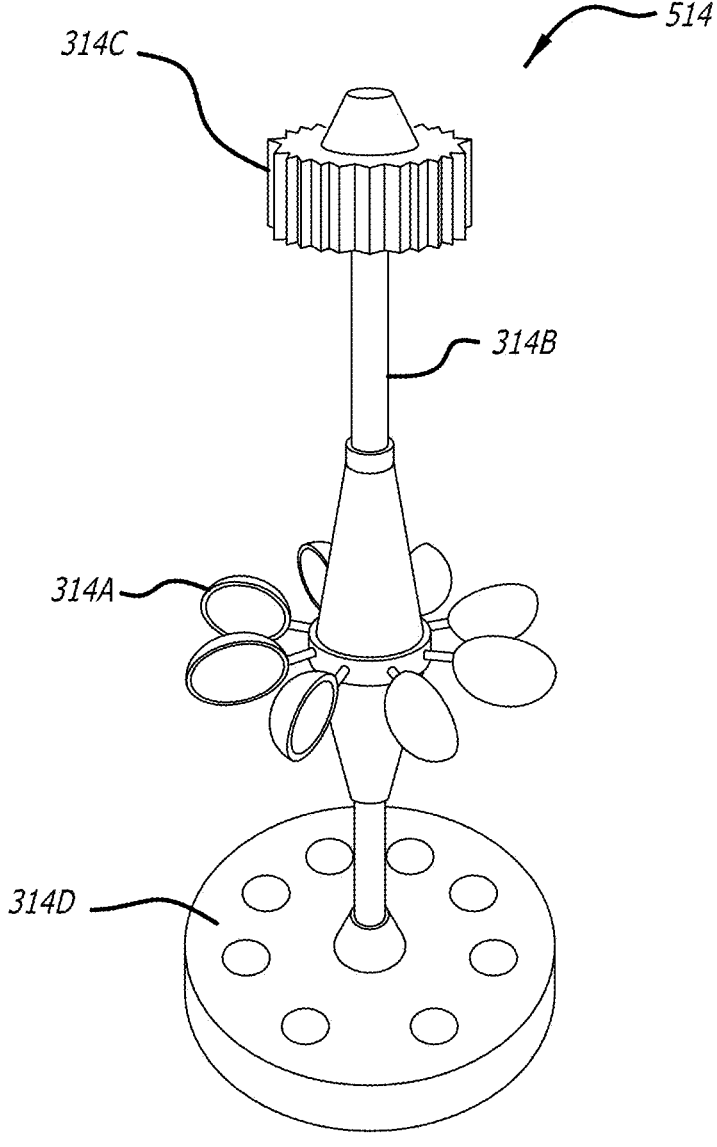
FIG. 5 illustrates an example embodiment of an example capture device, according to the present disclosure.

FIG. 5 illustrates an example embodiment 514 of an example energy capture device (e.g., similar to the capture device 114), according to the present disclosure. In the illustrated example of FIG. 5, the capture device 514 includes the plurality of blades 314a, the rotor shaft 314b, and the joint or gear 314c. Further, in the illustrated example, the capture device 514 also includes a motor flange 314d. The motor flange 314d may be configured to selectively couple the capture device 514 to an electric machine (i.e., motor or generator). For example, an electric motor can be coupled to the flange 314d to facilitate regulating a torque of the rotor shaft 314b or operating the capture device 514 (at least temporarily) as a PTO device. In other examples, an electric generator can be coupled to the flange 314d to convert a portion of the torque of rotor shaft 314b to electrical power for powering one or more local components of the system 100. For example, referring to FIG. 3, a generator coupled to the flange 314d can be used to power the valves 112a, 112c.

Figure 6:
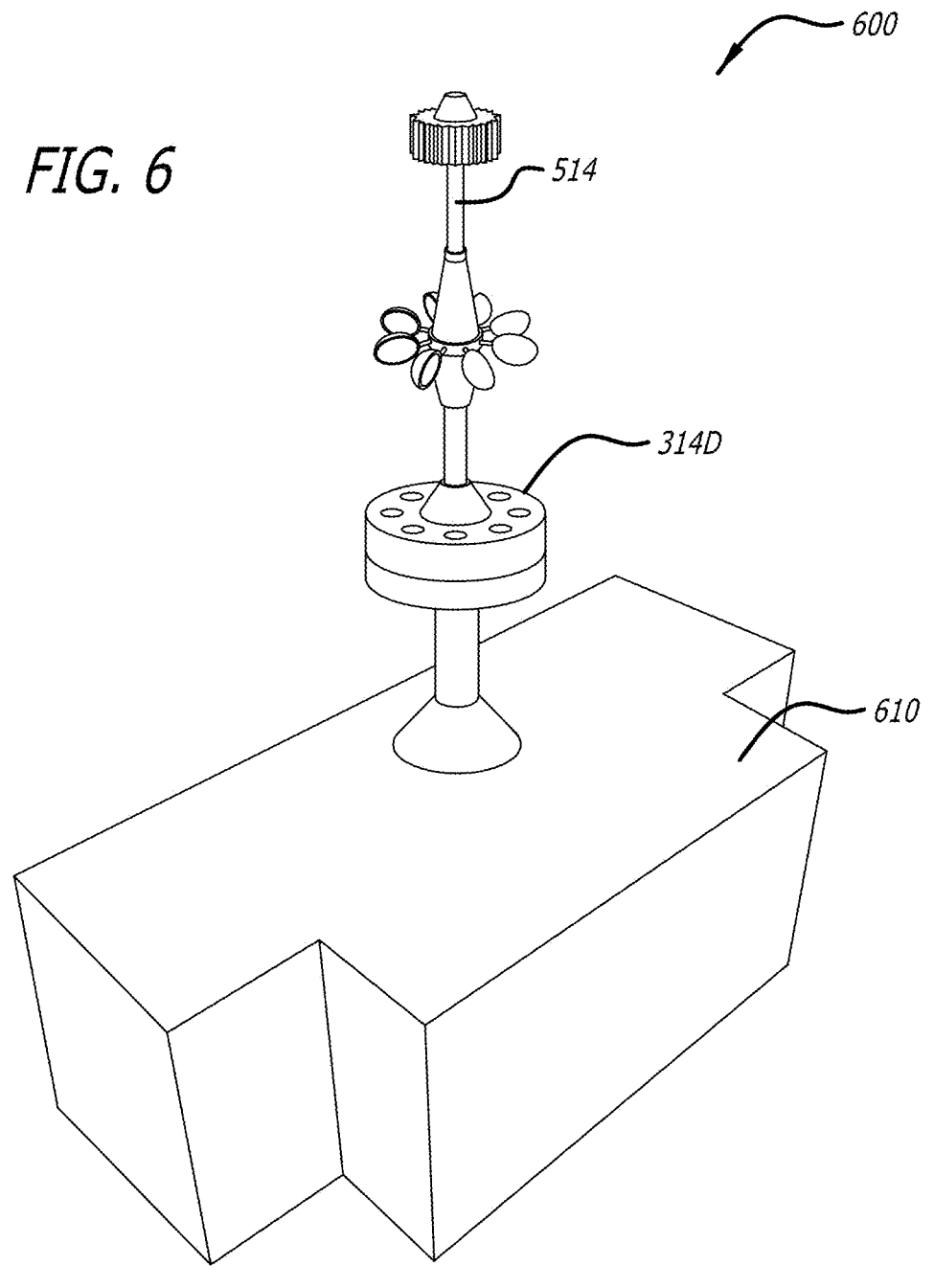
FIG. 6 illustrates an example embodiment of an example capture device coupled to an example electric motor/generator, according to the present disclosure.

FIG. 6 illustrates another alternate embodiment 600 of an example power system, according to the present disclosure. The system 600 shows an example configuration where an electrical motor/generator is coupled to the flange 314d of the energy capture device 514, in line with the discussion above.

Figure 7:
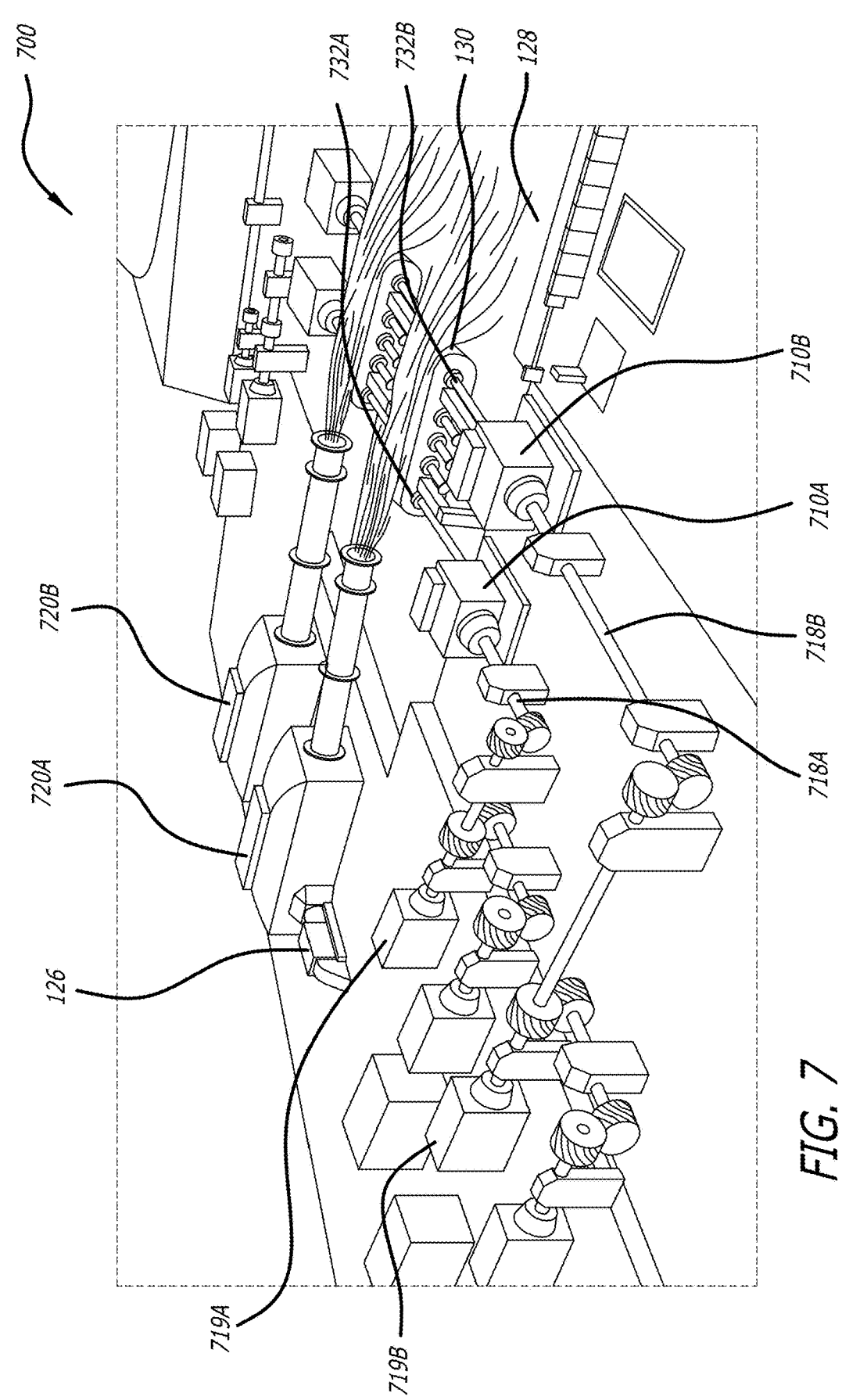
FIG. 7 illustrates another alternate embodiment of an example power system, according to the present disclosure.

FIG. 7 illustrates another alternate embodiment 700 of an example power system, according to the present disclosure. System 700 represents an example power system configuration that can be implemented in a land-based site (e.g., 120A, 120B, etc.), a submersible enclosure (e.g., 110), or a mobile platform (e.g., vehicle, submarine, ship, etc.).

In the illustrated example, system 700 includes the turbine conveyer 130 which is configured to receive a high-pressure stream of water flowing above and/or below the turbine conveyer 130. The stream of water causes the turbine conveyer 130 to rotate one or more rotor shafts (e.g., 732A, 732B, etc.) of the turbine conveyer 130.

In the illustrated example, the system 700 also includes electric machines 710A-B which may be similar to electric machine 610. For example, electric machine 710A may be coupled to a first rotor shaft 732A of the turbine conveyer 130 and electric machine 710B may be coupled to a second rotor shaft 732B of the turbine conveyer 130. Further, electric machine 710A can be operated as an electric motor to increase, regulate, or otherwise adjust a torque of the rotor shaft 732A or as an electric generator that converts at least a portion of the torque of the rotor shaft 732A to generate electrical power. Similarly, electric machine 710B can be operated as an electric motor or as an electric generator coupled to the rotor shaft 732B.

In the illustrated example, system 700 also includes transfer devices 718A-B (e.g., PTO devices, energy transfer pipes, etc.) which transfer, respectively, at least a portion of the torque of rotor shafts 732A-B from respective proximal ends of the transfer devices 718A-B (i.e., the ends connected to the electric machines 710A-B) to respective distal ends of the transfer devices 718A-B (i.e., the ends connected to transfer terminals 719A-B). Transfer terminals 719A-B may each include a transmission system (e.g., gears, etc.) to redirect the torque received from the transfer devices 718A-B to different destinations (e.g., other transfer devices, generators, pumps, etc.) that can be within the system 700 (e.g., pump 126) or outside the system 700 (e.g., a different power distribution site or submersible enclosure).

In the illustrated example, the system 700 also includes the water storage tank 128, which may store water locally at a lower pressure than the pressure of the water stream that actuates the turbine conveyer 130. For example, the water storage tank 128 may store the water flowing out of water dispensers 720A-720B after the water flows above the turbine conveyer 130.

The water dispensers 720A-B are devices configured to direct, respectively, a high-pressure stream of water to drive or rotate a turbine conveyer (e.g., 130). In the illustrated example, the dispensers 720A-B drive different turbine conveyers. In alternative examples, the dispensers 720A-B may drive a same turbine conveyer (e.g., by directing a first water stream above the turbine conveyer and a second water stream below the conveyer, etc.).

In examples, a water dispenser (e.g., 720B) may be configured to receive the high-pressure water stream from a surrounding environment. For example, where the system 700 is implemented inside a submersible enclosure (e.g., enclosure 110), the dispenser 720B may receive a high-pressure stream of water from the body of water in which the enclosure 110 is submerged (e.g., seabed or ocean depth, etc.) and direct the incoming flow of pressurized water to a turbine conveyer.

In alternative or additional examples, a water dispenser (e.g., 720A), together with the water pump 126, may be configured to pressurize water from the local water storage tank 128 to generate the high-pressure stream of water that drives the turbine conveyer 130. In an example, the water pump 126 may receive a torque transferred from one or more sources (e.g., PTO devices, etc.) inside the system 700 (e.g., via transfer devices 718A, 718B, etc.) or outside the system 700 (e.g., from a remote power distribution site similar to sites 120A, 120B or from a remote submerged enclosure similar to 110). In another example, the water pump 126 may be powered by an electric motor (e.g., 710A or 710B) or other type of motor.

Thus, for example, the system 800 can be deployed on land or in a mobile unit or in any other site that is not submerged in high-pressure ocean depths. In this example, the water dispenser 720A can pressurize its available locally stored water using the torque transferred from a remote system (e.g., enclosure 110) that is present in a high-pressure marine environment.

Figure 8:
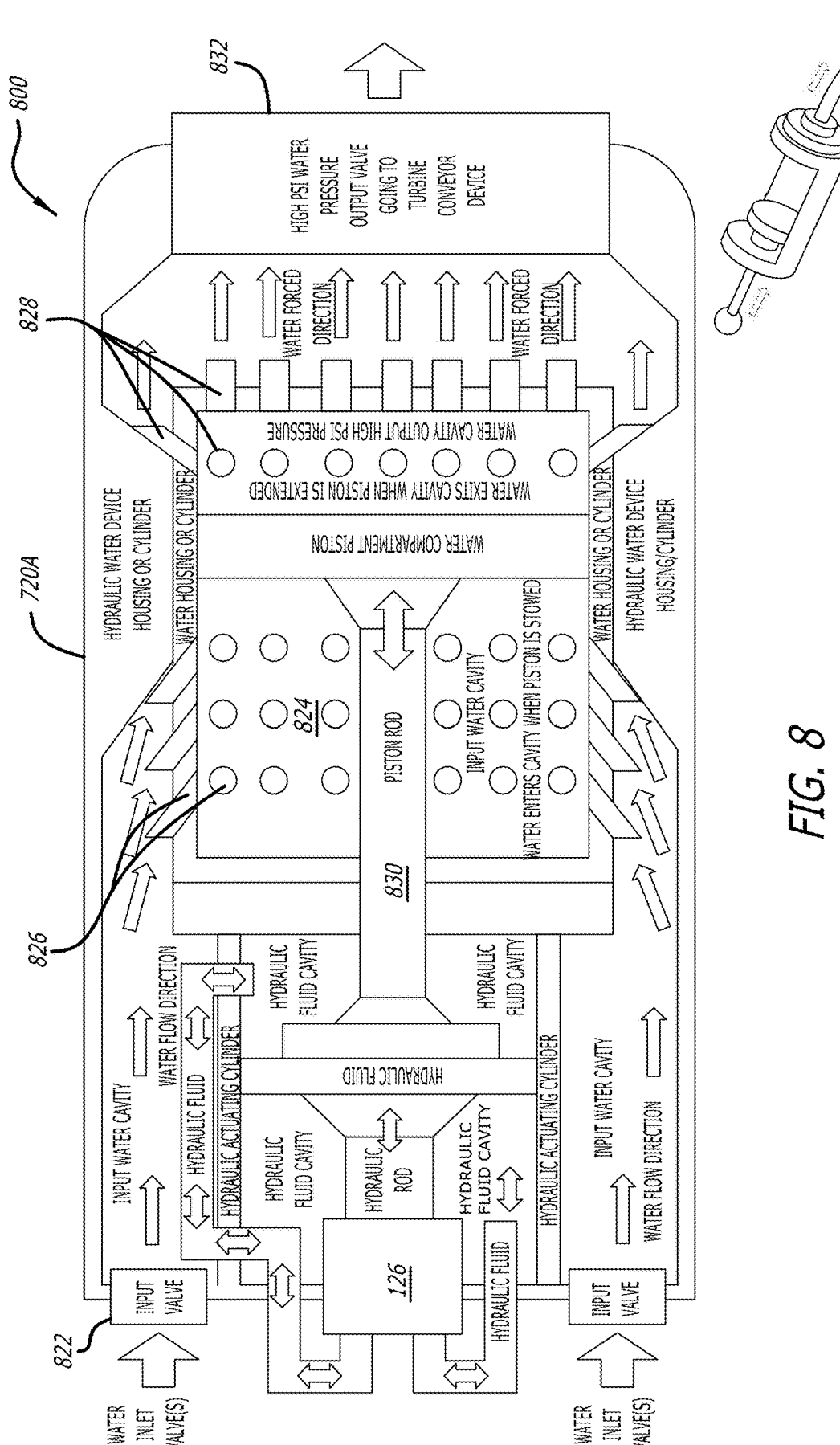
FIG. 8 illustrates another alternate embodiment of an example power system, according to the present disclosure.

FIG. 8 illustrates another alternate embodiment 800 of an example power system, according to the present disclosure. In the illustrated example, the water dispenser 720A is configured as a hydraulic water dispenser in which low-pressure water (e.g., from the storage tank 128) is pumped (e.g., using a hydraulic water pump 126) to produce the high-pressure water stream dispensed from the dispenser 720A to drive the turbine conveyer 130.

In the illustrated example, the hydraulic water dispenser 720A includes one or more input valves 822, a cylinder 824 having one or more inlets 826 and one or more outlets 828, a piston rod 830, and an output valve 832. In this example, the dispenser 720A could thus receive water having a relatively low pressure (e.g., from water storage tank 128) via the input valve(s) 822 and direct the received (unpressurized) water into the cylinder 824 via the inlet(s) 826. The piston rod 830 can then compress the water in the cylinder 824 and force it out of the outlet(s) 828 as a high pressure water stream flowing out of the dispenser 720A via the output valve 832 (e.g., toward the turbine conveyer 130).

Figure 9:
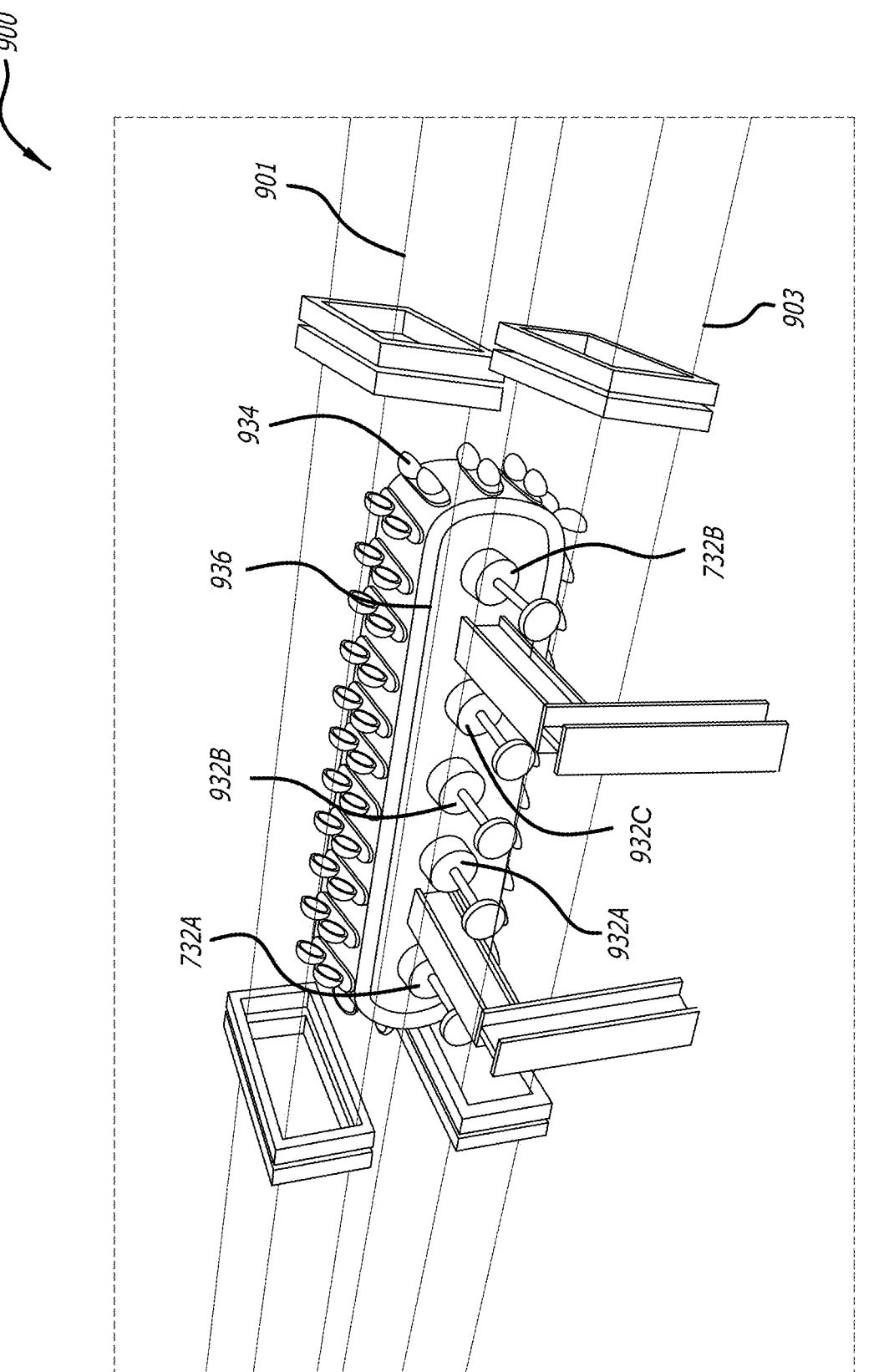
FIG. 9 is a partial illustration of another alternate embodiment of an example power system, according to the present disclosure.

FIG. 9 illustrates another alternate embodiment 900 of an example power system, according to the present disclosure. The illustration of system 900 of FIG. 9 may represent a partial view of a power system similar to system 700 for example. In the illustrated example, the turbine conveyer 130 includes a plurality of blades 934, a conveyer belt 936, and a plurality of rotor shafts 732A-B and 932A-C.

The plurality of blades 934 are disposed on the conveyer belt 936 and so as to rotate the conveyer belt when a high pressure water stream flows above (e.g., stream 901) or below (e.g., stream 903) the conveyer belt 936. The conveyer belt 936, in turn, is coupled to the plurality of rotor shafts 732A-B and 932A-C so as to rotate the plurality of rotor shafts. The stream 901, for example, may correspond to the high pressure water stream dispensed out of the water dispenser 720A of FIG. 7.

In an example, the stream 903 may correspond to a stream of water that is pulled into the dispenser 720a through the input valve(s) 822 of FIG. 8. In an alternative example, the stream 903 may correspond to another stream of water dispensed from a second water dispenser (e.g., similar to dispenser 720A). Referring back to FIG. 7 by way of example, an alternative configuration of the system 700 may include the second dispenser arranged opposite the dispenser 720A to dispense the stream 903 below the turbine conveyer 130. In some examples, the streams 901, 903 may comprise tubes or water channels configured to direct water flowing inside the tubes 901, 903 across the conveyer belt 936 as shown.

In examples, the plurality of rotor shafts includes one or more rotor shafts (e.g., 732A-B) connected to an external transfer device (e.g., 718A-718B) or an external electrical machine (e.g., 710A-710B). In additional or alternative examples, the plurality of rotor shafts includes one or more rotor shafts (e.g., 932A-C) that are not necessarily connected to the external electrical machines or transfer devices directly but that may be connected to them indirectly (e.g., via the rotor shafts 710A-710B).

Figure 10:
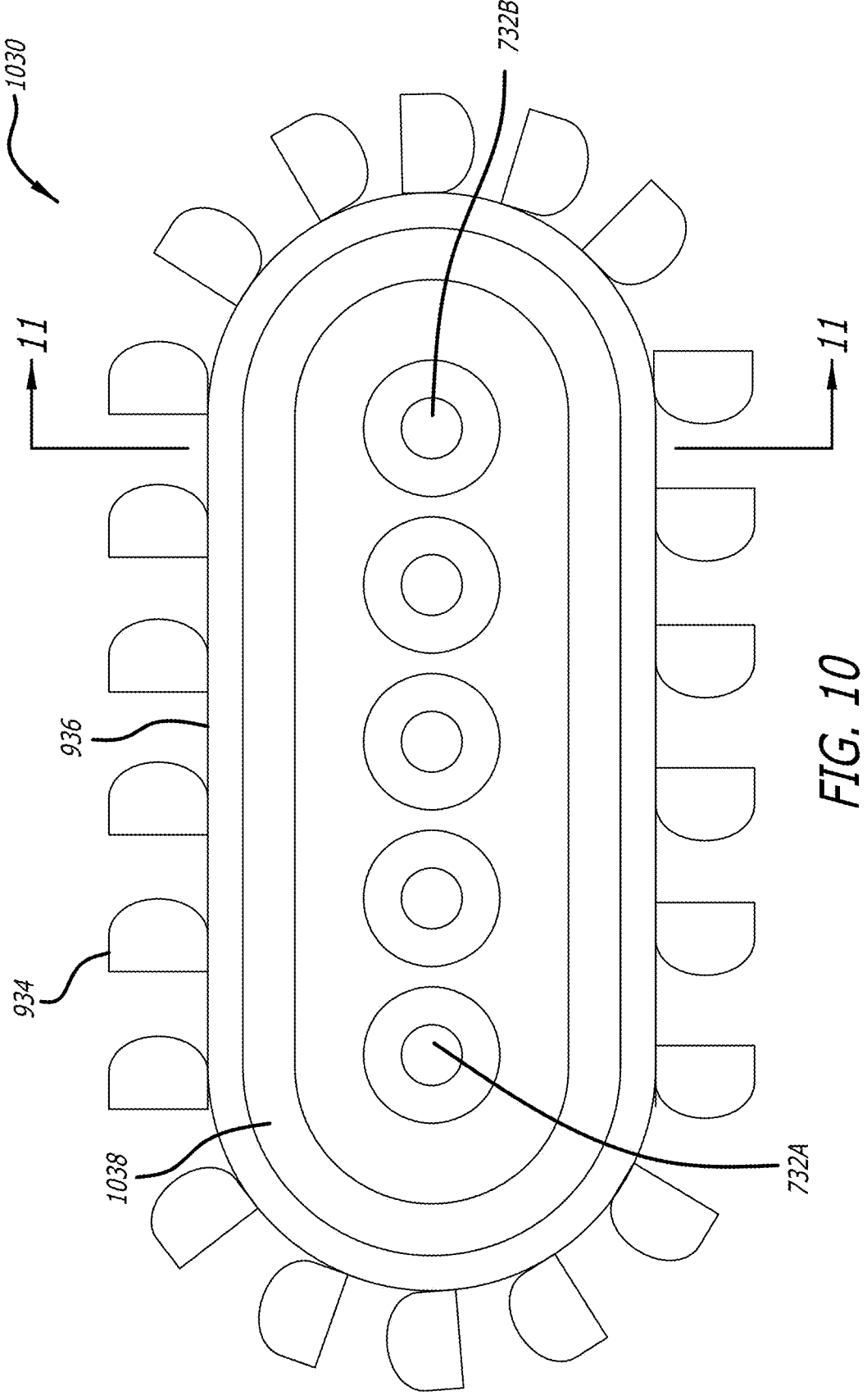
FIG. 10 and FIG. 11 illustrate cross section views of an example embodiment of an example turbine conveyer device, according to the present disclosure.
Figure 11:
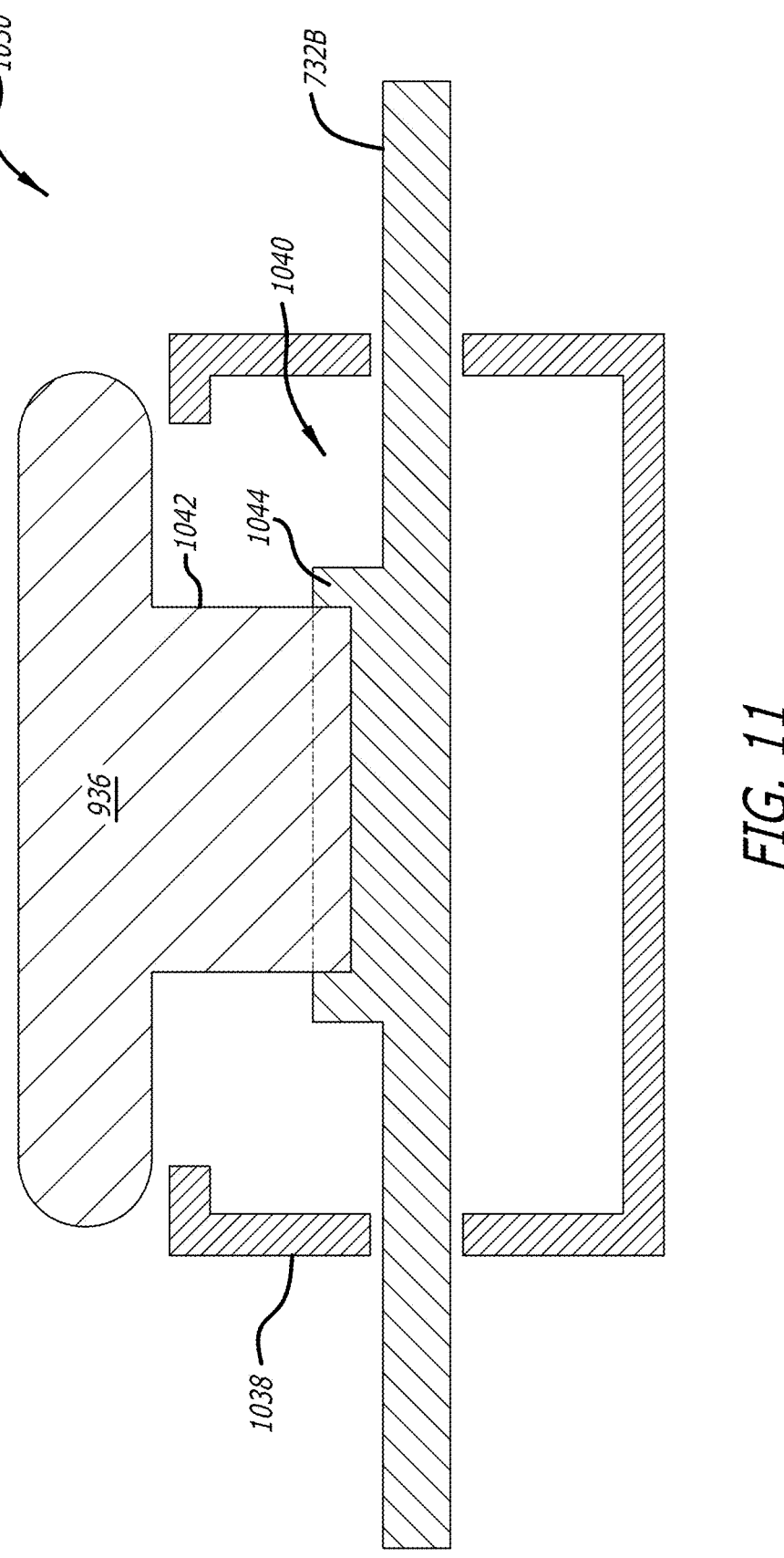

FIG. 10 illustrates a cross-section view of an alternative embodiment 1030 of an example turbine conveyer device, according to the present disclosure. FIG. 11 illustrates another crosssection view of the turbine conveyer 1030 (i.e., along the A-A lines depicted in FIG. 10). The turbine conveyer 1030 may be similar to the turbine conveyer 130 of the systems 100 and 700, for example. In the illustrated example, the turbine conveyer 1030 includes a mounting structure 1038 that supports a plurality of rotor blades (e.g., 732A-B, etc.) of the turbine conveyer 1030. As best shown in FIG. 11 for example, the mount 138 may be configured to reduce physical contact between the conveyer belt 936 and the rotor shafts 732A-B, etc.) by defining a cavity 1040 between the conveyer belt 936 and the rotor shafts as a friction-less buffer to reduce an area of physical contact between the conveyer belt 936 and the rotor shafts 732A-B.

In some examples, the conveyer belt 1030 may include a magnetic separation mechanism configured to maintain the separation cavity 1040 by inducing a magnetic force between the rotor shafts 732A-B and the mount 1038. For example, the mount 1038, the rotor shafts 732AB, etc., and/or the conveyer belt 936 may include one or more magnets arranged such that a same polarity of corresponding magnets face one another to induce a magnetic force that resists physical contact between the rotor shafts 732A-B, etc. and the conveyer belt 1042 (e.g., by means of magnetic repulsion between the magnets, etc.) at least within the cavity 1040.

In an example, the turbine conveyer 1030 includes a first magnet 1042 disposed on the conveyer belt 936 (e.g., on a flap of the conveyer belt protruding downwards toward the rotor shafts) and a second magnet 1044 disposed on the rotor shaft 732B (e.g., on a corresponding flap of the rotor shaft 732B protruding upwards toward the conveyer belt 936). The magnets 1042, 1044 may be arranged to approach and/or overlap one another as the conveyer belt 936 is rotating. Furthermore, the magnets 1042, 1044 may be arranged such that each magnet has a same polarity facing the other magnet. With this arrangement for example, a magnetic force may be induced between the magnets 1042, 1044 to magnetically propel (and therefore rotate) the rotor shaft 732B in a contact-less manner. For example, a magnetic repulsion force between the magnets 1042, 1044 may be induced when the flap of the conveyer belt 936 (on which the magnet 1042 is mounted) approaches the flap of the rotor shaft 732B (on which the magnet 1044 is mounted) to cause the rotor shaft 732B to rotate without necessarily touching the conveyer belt 936. With this arrangement, for example, the turbine conveyer 1030 may advantageously induce a torque in the rotor shaft 732B in a contact-less manner to minimize energy losses associated with mechanical friction.

Figure 12:
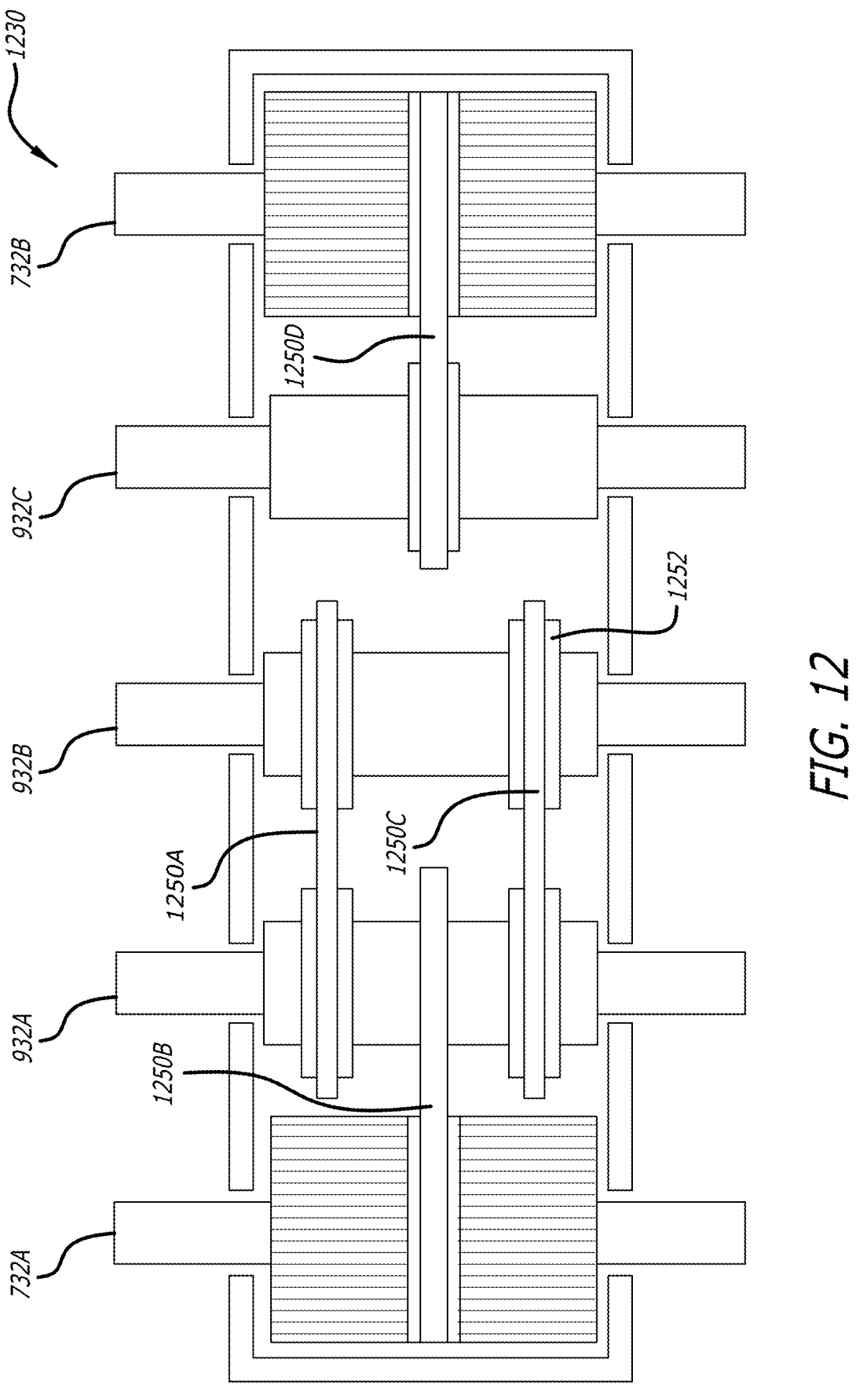
FIG. 12 illustrates a cross section view of an alternate embodiment of an example turbine conveyer device, according to the present disclosure.

FIG. 12 illustrates a cross-section view of an alternative embodiment 1230 of an example turbine conveyer device, according to the present disclosure. In the illustrated example, the turbine conveyer 1230 (which may be similar to the turbine conveyers 130 and/or 1030) includes a plurality of chains 1250A-1250D (collectively referred to herein as a plurality of belts or chains 1250) and a plurality of gears 1252.

In examples, the chains 1250 and the gears 1252 are configured to couple one or more of the rotor shafts 732A-B, 932A-C so as to combine the torques of the connected rotor shafts. For example, the chain 1250B may couple the rotor shafts 732A and 932A and the chains 1250A and 12500 may couple the rotor shaft 932A with the rotor shaft 932B. With this arrangement, referring back to FIG. 7 for example, the torque output by the rotor shaft 732A to the electric motor/ generator 710A (and to the transfer device 718A) could be increased by relying on the torques of rotor shafts 932A-B which are connected (internally) to the rotor shaft 732A via the chains 1250A-C. Similarly, as best shown in FIGS. 7 and 12, a maximum torque output from the rotor shaft 732B (e.g., to the motor/generator 710B and/or the transfer device 718B) may be increased by combining the torque of rotor shaft 932C with that of shaft 732B internally via the chain 1250D. Thus, in various examples, the turbine conveyer 1230 may advantageously enable a system of the present disclosure to output different amounts of torque (and thus different portions of the harnessed hydrokinetic energy) by connecting different numbers and/or combinations of rotor shafts (e.g., internally via the chains 1250A-D) to one or more transfer devices.

In some examples, the turbine conveyer device 1230 may be configured to dynamically adjust one or more of the chains 1250A-D and the gears 1252. Referring back to FIG. 1 by way of example, consider a scenario where the turbine conveyer 1230 is employed to transmit power (in the form of torque) to the power distribution site 120B and one or more devices (e.g., generator 124) at the site 120A. At times when power needs at the site 120B are relatively high, the controller 140 may cause the turbine conveyer 1230 to combine the torques of relatively more rotor shafts into an output torque connected to the transfer device 118B (and transferred to the site 1208). As another example, in this scenario, if the power demands of the site 120A are relatively high (e.g., generator(s) 124 operating at a high capacity, etc.), relatively more rotor shafts can be coupled together to power the generator(s) 124, and so on.

Figure 13:
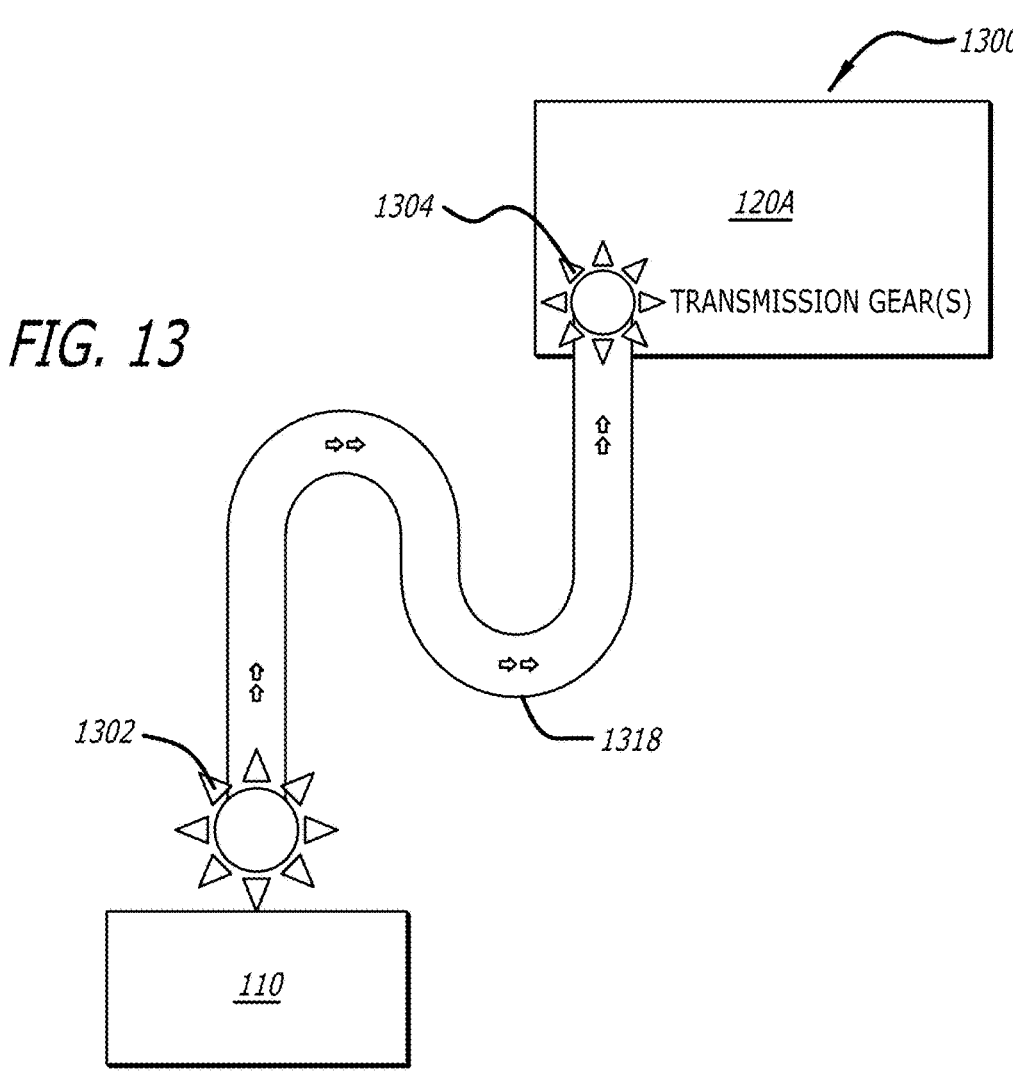
FIG. 13 illustrates another alternate embodiment of an example power system, according to the present disclosure.

FIG. 13 illustrates an alternative embodiment 1300 of an example power system, in accordance with the present disclosure. In the illustrated example, the system 300 includes a flexible energy transfer cable 1318 (e.g., similar to any of transfer devices 118A-B, etc.) that extends lengthwise from a first end 1302 of the flexible cable 1318 to a second end 1304 of the flexible cable 1318. For instance, the flexible cable 1318 may be configured to transfer a torque received from a source (e.g., enclosure 110) connected to the flexible cable 1318 at the first end 1302 to a destination (e.g., site 120A) connected to the flexible cable 1318 at the second end 1304. In examples, the flexible cable 1318 may be configured to flexibly extend lengthwise without necessarily conforming to a rigid path.

Figure 14:
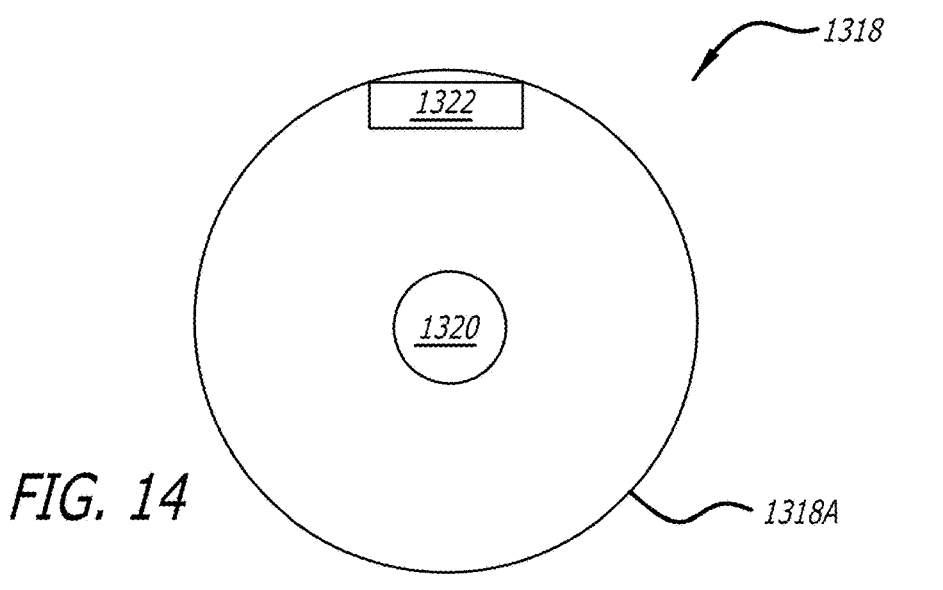
FIG. 14 illustrates a cross section view of an example embodiment of an example flexible cable, according to the present disclosure.

FIG. 14 illustrates a cross-section view of the flexible cable 1318 of FIG. 13. In the illustrated example, the energy transfer device or flexible cable 1318 includes a wire 1320 disposed inside the flexible cable 1318. The wire 1320 is configured to transfer the torque received by the flexible cable at the first end 1302 to the second end 1304 by rotating (e.g., about an axis perpendicular to the page in the illustration of FIG. 14) inside the flexible cable 1318. For example, the wire 1320 may be an auger wire or any other type of wire enclosed within an outer wall 1318a of the flexible cable or transfer device 1318.

In examples, the flexible cable 1318 may also include a magnetic suspension mechanism 1322 which may include components disposed on the wall 1318a (as shown in FIG. 14) and/or the wire 1320. The suspension mechanism 1322 may be configured to magnetically separate and/or reduce physical contact between the wire 1320 and the wall 1318a at least in a lengthwise portion of the flexible cable 1318a. For example, the magnetic suspension or levitation mechanism 1322 may include any combination of magnets, electromagnets, and/or any other type of magnetic apparatus configured to induce a magnetic force between the wire 1320 and the wall 1318a to resist movement of the wire 1320 toward the wall 1318a. With this arrangement, for example, the flexible cable 1318 may advantageously reduce or prevent energy loss associated with friction while the wire 1320 is rotating inside the flexible cable 1318 (e.g., by attempting to prevent the wire 1320 from touching the wall 1318a using magnetic forces).

Figure 15:
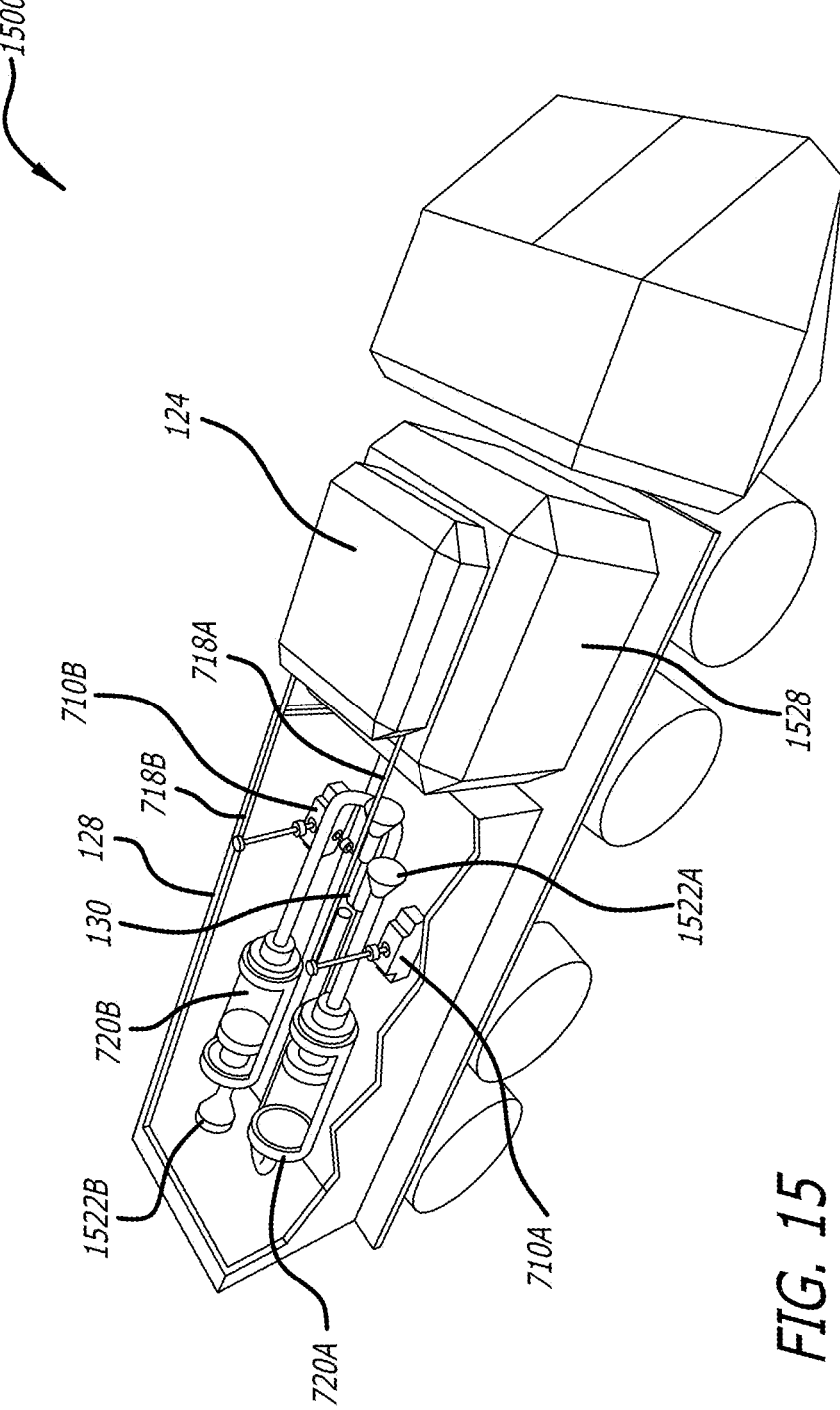
FIG. 15 illustrates another alternate embodiment of an example power system having a portable configuration, according to the present disclosure.

FIG. 15 illustrates an alternative embodiment 1500 of an example power system, according to the present disclosure. The system 1500, for example, may represent a portable or mobile deployment configuration of the system 100 and/or any of the other power systems described in the present disclosure. For example, the system 1500 can be used to provide one or more outputs with flexible capacities at remote locations by harnessing power from pressurized water stored in a local storage tank 1528. For example, power output from the system 1500 can be used to power cities, vehicles, any of the sites 120A-B, water dispensers 720A-B, generator 124, and/or to refill or pressurize the water in the tank 1528.

In the illustrated example, the dispenser 720A may have an inlet 1522A (similar to input valve 822 of FIG. 8) configured to draw unpressurized water from the storage tank 128. On the other hand, the dispenser 720B may have an inlet 1522B that draws pressurized water from a pressurized water storage tank 1528. For instance, the dispenser 720B may be employed to harness hydrokinetic power stored in the high pressure conditions of tank 1528 to generate torque that drives the hydraulic water pumping dispenser 720A to pressurize the water from storage tank 128 into a stream that drives the conveyer 130. Thus, in some examples, a small amount of water from the high-pressure storage tank 1528 can be used (via dispenser 720B) to generate a sufficient amount of torque to pump more water using dispenser 720A (e.g., a stream that has slightly lower pressure that is sufficient to drive the conveyer 128 and produce a desired amount of power in the generators 710A-B).

Other configurations of the system 1500 are possible as well, such as any of the configurations described for any of the systems described in the present disclosure (e.g., 100, 700, etc.).

Advantages of the systems/example embodiments described herein, include a land based power plant, reusable circulating water, an entire power plant being powered by one of the turbine generators, an energy storage unit being used to start a power plant, power plant construction has less regulations and can be deployed anywhere on land, energy system can be completely perpetual, except for maintenance and repairs, it is not affected by cold, hot or other weather extremes, it can provide broadband internet service to remote locations, and leaves no carbon footprint behind.

The preceding disclosures are illustrative embodiments. It should be appreciated by those of skill in the art that the devices, techniques and methods disclosed herein elucidate representative embodiments that function well in the practice of the present disclosure. However, those of skill in the art should, in light of the present disclosure, appreciate that many changes can be made in the specific embodiments that are disclosed and still obtain a like or similar result without departing from the spirit and scope of the invention.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements.

The terms "a" and "an" and "the" and similar referents used in the context of describing the invention (especially in the context of the following claims) are to be construed to cover both the singular and the plural, unless otherwise indicated herein or clearly contradicted by context. Recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided herein is intended merely to better illuminate the invention and does not pose a limitation on the scope of the invention otherwise claimed. No language in the specification should be construed as indicating any non-claimed element essential to the practice of the invention.

The use of the term "or" in the claims is used to mean "and/or" unless explicitly indicated to refer to alternatives only or the alternatives are mutually exclusive, although the disclosure supports a definition that refers to only alternatives and "and/or."

Groupings of alternative elements or embodiments of the invention disclosed herein are not to be construed as limitations. Each group member may be referred to and claimed individually or in any combination with other members of the group or other elements found herein. It is anticipated that one or more members of a group may be included in, or deleted from, a group for reasons of convenience and/or patentability. When any such inclusion or deletion occurs, the specification is herein deemed to contain the group as modified thus fulfilling the written description of all Markush groups used in the appended claims.

Preferred embodiments of this invention are described herein, including the best mode known to the inventors for carrying out the invention. Of course, variations on those preferred embodiments will become apparent to those of ordinary skill in the art upon reading the foregoing description. The inventor expects those of ordinary skill in the art to employ such variations as appropriate, and the inventors intend for the invention to be practiced otherwise than specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

Specific embodiments disclosed herein may be further limited in the claims using consisting of or consisting essentially of language. When used in the claims, whether as filed or added per amendment, the transition term "consisting of" excludes any element, step, or ingredient not specified in the claims. The transition term "consisting essentially of" limits the scope of a claim to the specified materials or steps and those that do not materially affect the basic and novel characteristic(s). Embodiments of the invention so claimed are inherently or expressly described and enabled herein.

Further, it is to be understood that the embodiments of the invention disclosed herein are illustrative of the principles of the present invention. Other modifications that may be employed are within the scope of the invention. Thus, by way of example, but not of limitation, alternative configurations of the present invention may be utilized in accordance with the teachings herein. Accordingly, the present invention is not limited to that precisely as shown and described.

What is claimed is:

1. A system comprising:
a capture device coupled to an enclosure, the capture device including a rotor shaft and a plurality of blades coupled to the rotor shaft, wherein the plurality of blades are arranged to receive a flow of water when the enclosure is submerged in a body of water, wherein the flow of water causes the plurality of blades to rotate the rotor shaft;
a transfer device extending lengthwise from a first end to a second end of the transfer device, wherein the transfer device is mechanically coupled to the capture device at the first end and configured to transfer a torque of the rotating rotor shaft from the first end to the second end, wherein the second end is located outside the enclosure
a pump disposed upstream of the plurality of blades and configured to increase a pressure of the water flowing toward the capture device;
a conveyer belt, wherein the plurality of blades are disposed on the conveyer belt, wherein the flow of water includes a first stream of water from the pump that causes the plurality of blades to rotate the conveyer belt;
a plurality of rotor shafts disposed in the conveyer belt, wherein the rotor shaft is a first rotor shaft of the plurality of rotor shafts, wherein the conveyer belt rotates the plurality of rotor shafts, wherein the transfer device is a first transfer device and the torque is a first torque, wherein the first transfer device extends lengthwise to transfer the first torque from the first rotor shaft to a first destination; and
a second transfer device coupled to a second rotor shaft of the plurality of rotor shafts, wherein the second transfer device extends lengthwise to transfer a second torque of the second rotor shaft to a second destination.

2. The system of claim 1, wherein the second end is coupled to a generator configured to generate electrical power using the transferred torque.

3. The system of claim 2, wherein the generator is disposed outside the body of water.

4. The system of claim 1, wherein the second end of the transfer device is located outside the body of water.

5. The system of claim 1, wherein the capture device is disposed inside the enclosure.

6. The system of claim 1, wherein the transfer device comprises a first pipe extending lengthwise, in a first direction, away from the first end.

7. The system of claim 6, wherein the transfer device comprises a second pipe extending lengthwise, in a second direction, away from the first pipe.

8. The system of claim 1, wherein the transfer device comprises a flexible cable extending lengthwise between the first end and the second end of the transfer device.

9. The system of claim 8, wherein the transfer device comprises a wire disposed inside the flexible cable and configured to transfer the torque of the rotor shaft by rotating inside the flexible cable.

10. The system of claim 9, wherein the wire includes an auger wire.

11. The system of claim 9, wherein the transfer device comprises a suspension apparatus disposed in the flexible cable and configured to induce a magnetic force on the wire so as to prevent or reduce physical contact between the flexible cable and the wire in at least a lengthwise portion of the flexible cable.

12. The system of claim 1, further comprising: an intake port disposed along a periphery of the enclosure to transport the flow of water into the enclosure and toward the capture device.

13. The system of claim 1, wherein the pump is a turbopump.

14. The system of claim 1, wherein the pump is a hydraulic pump.

15. The system of claim 1, wherein the second transfer device is configured to transfer the second torque to the pump, wherein the second torque powers the pump.

16. The system of claim 15, wherein the rotor shaft is a first rotor shaft, wherein a first stream of water that drives rotation of the first rotor shaft is different than a second stream of water that drives rotation of a second rotor shaft having the second torque.

17. The system of claim 1, further comprising:

a tank storing water, wherein the pump is a first pump configured to pump water from the tank to form the first stream of water flowing above the conveyer belt to actuate the plurality of blades; and a second pump configured to pump water from the tank to form a second stream of water flowing below the conveyer belt to actuate the plurality of blades.

18. The system of claim 1, wherein the transfer device is a first transfer device, and the second transfer device extends lengthwise from a first location of the second end of the first transfer device to a second location, wherein the second transfer device is configured to transfer a portion of the torque from the first transfer device to the second location.

* * * * *